US010537044B2

(12) United States Patent
Suzuki et al.

(10) Patent No.: US 10,537,044 B2
(45) Date of Patent: Jan. 14, 2020

(54) HEAT DISSIPATING COMPONENT, MANUFACTURING METHOD FOR HEAT DISSIPATING COMPONENT, ELECTRONIC DEVICE, MANUFACTURING METHOD FOR ELECTRONIC DEVICE, INTEGRATED MODULE, AND INFORMATION PROCESSING SYSTEM

(71) Applicant: FUJITSU LIMITED, Kawasaki-shi, Kanagawa (JP)

(72) Inventors: Takashi Suzuki, Sagamihara (JP); Kanae Nakagawa, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/215,174

(22) Filed: Jul. 20, 2016

(65) Prior Publication Data
US 2016/0338228 A1 Nov. 17, 2016

Related U.S. Application Data

(63) Continuation of application No. PCT/JP2014/068227, filed on Jul. 8, 2014.

(30) Foreign Application Priority Data

Jan. 21, 2014 (JP) .................. 2014-008950

(51) Int. Cl.
*H05K 7/20* (2006.01)
*H01L 23/36* (2006.01)
(Continued)

(52) U.S. Cl.
CPC ......... *H05K 7/20436* (2013.01); *G08G 1/042* (2013.01); *H01L 21/4878* (2013.01);
(Continued)

(58) Field of Classification Search
CPC . H01L 24/48; H01L 21/4882; H01L 21/4878; H01L 35/02; H01L 23/3675;
(Continued)

(56) References Cited

U.S. PATENT DOCUMENTS 5,108,955 A 4/1992 Ishida et al.
5,179,039 A 1/1993 Ishida et al.
(Continued)

FOREIGN PATENT DOCUMENTS

CN 102047414 A 5/2011
EP 0 865 082 A1 9/1998
(Continued)

OTHER PUBLICATIONS

International Search Report PCT/JP2014/068227, dated Oct. 8, 2014, 5 pages.
(Continued)

*Primary Examiner* — Mukundbhai G Patel
(74) *Attorney, Agent, or Firm* — Kratz, Quintos & Hanson, LLP

(57) ABSTRACT

A heat dissipating component comprising: a main body formed from a first material; a heat dissipating sheet that is formed from a second material having higher thermal conductivity than the first material, that is provided at the main body, and that includes a plurality of fins thermally connected to each other at positions other than apexes and a connecting portion thermally connecting the plurality of fins to an electronic component; and a covering portion that covers at least a portion of a bottom portion of a groove between the plurality of fins.

15 Claims, 34 Drawing Sheets

(51) Int. Cl.
*H01L 23/433* (2006.01)
*G08G 1/042* (2006.01)
*H01L 23/31* (2006.01)
*H01L 21/56* (2006.01)
*H01L 21/48* (2006.01)
*H01L 23/367* (2006.01)
*H01L 23/373* (2006.01)
*H01L 23/00* (2006.01)
*H01L 35/02* (2006.01)

(52) U.S. Cl.
CPC ........ *H01L 21/4882* (2013.01); *H01L 21/565* (2013.01); *H01L 23/3121* (2013.01); *H01L 23/36* (2013.01); *H01L 23/3675* (2013.01); *H01L 23/373* (2013.01); *H01L 23/4334* (2013.01); *H01L 24/48* (2013.01); *H01L 35/02* (2013.01); *H01L 2224/48091* (2013.01); *H01L 2224/48106* (2013.01); *H01L 2224/48227* (2013.01); *H01L 2224/48472* (2013.01); *H01L 2224/73215* (2013.01); *H01L 2924/00014* (2013.01); *H01L 2924/1815* (2013.01)

(58) Field of Classification Search
CPC . H01L 23/373; H01L 23/3121; H01L 21/565; H01L 23/4334; H01L 23/36; H01L 23/3735; H01L 2924/00014; H01L 2224/48106; H01L 2224/48227; H05K 7/20436; G08G 1/042
See application file for complete search history.

(56) References Cited

U.S. PATENT DOCUMENTS

| | | | | |
|---|---|---|---|---|
| 5,200,809 A | * | 4/1993 | Kwon | H01L 23/367 257/707 |
| 5,233,225 A | | 8/1993 | Ishida et al. | |
| 5,289,039 A | | 2/1994 | Ishida et al. | |
| 5,934,079 A | * | 8/1999 | Han | H05K 7/206 62/259.2 |
| 6,208,513 B1 | * | 3/2001 | Fitch | H01L 23/3672 165/185 |
| 6,408,935 B1 | * | 6/2002 | DeHoff | H01L 23/3737 165/104.33 |
| 6,552,428 B1 | | 4/2003 | Huang et al. | |
| 6,735,450 B1 | * | 5/2004 | Remmert | H04B 1/38 361/688 |
| 7,934,888 B2 | * | 5/2011 | Masters | F16L 1/123 405/216 |
| 2011/0031612 A1 | | 2/2011 | Mitsui | |
| 2014/0311544 A1 | | 10/2014 | Kurihara | |

FOREIGN PATENT DOCUMENTS

| | | |
|---|---|---|
| EP | 2 293 328 A1 | 3/2011 |
| JP | 01-201941 A | 8/1989 |
| JP | 05-326762 A | 12/1993 |
| JP | 07-007110 A | 1/1995 |
| JP | 2002-314013 A | 10/2002 |
| JP | 2006-024948 A | 1/2006 |
| JP | 2009-152537 A | 7/2009 |
| JP | 2011-222706 A | 11/2011 |
| JP | 2012-066417 A | 4/2012 |
| WO | 2013103009 A1 | 7/2013 |

OTHER PUBLICATIONS

Chinese Office Action for corresponding Chinese Patent Application No. 201480075879.4 dated Feb. 23, 2018 (14 Sheets).
European Patent Application No. 14880107.9: Extended European Search Report dated May 10, 2017.
European Patent Application No. 14880107.9: Supplementary European Search Report dated Jan. 26, 2017.

* cited by examiner

FIG. 18
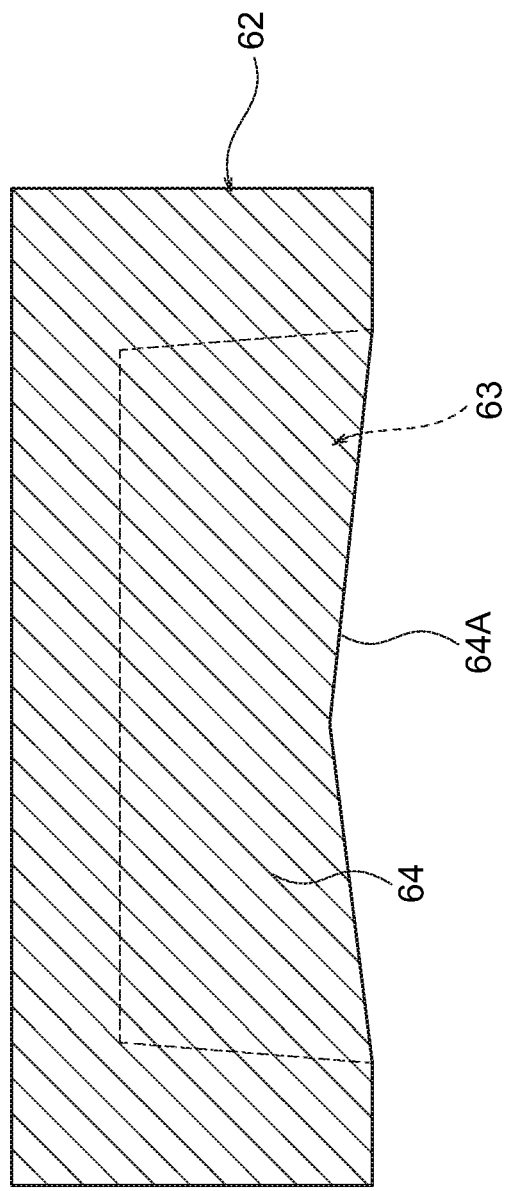
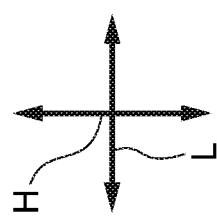

HEAT DISSIPATING COMPONENT, MANUFACTURING METHOD FOR HEAT DISSIPATING COMPONENT, ELECTRONIC DEVICE, MANUFACTURING METHOD FOR ELECTRONIC DEVICE, INTEGRATED MODULE, AND INFORMATION PROCESSING SYSTEM

CROSS-REFERENCE TO RELATED APPLICATION

This application is a continuation application of International Application No. PCT/JP2014/068227, filed Jul. 8, 2014, the disclosure of which is incorporated herein by reference in its entirety. Further, this application claims priority from Japanese Patent Application No. 2014-008950, filed on Jan. 21, 2014, the disclosure of which is incorporated herein by reference in its entirety.

FIELD

Technology disclosed herein relates to a heat dissipating component, a manufacturing method for a heat dissipating component, an electronic device, a manufacturing method for an electronic device, an integrated module, and an information processing system.

BACKGROUND

In an electronic device provided with an electronic component that requires heat dissipation, sometimes a heat dissipating component thermally connected to the electronic component is employed to dissipate heat.

In an electronic device provided with an heat dissipating component like that described above, there is a desire to be able to suppress lowering in heat dissipation performance of the heat dissipating component.

SUMMARY

An object of one aspect of technology disclosed herein is to suppress reduction of the heat dissipation performance of a heat dissipating component.

According to an aspect of the embodiments, a heat dissipating component includes: a main body formed from a first material; a heat dissipating sheet that is formed from a second material having higher thermal conductivity than the first material, that is provided at the main body, and that includes plural fins thermally connected to each other at positions other than apexes and a connecting portion thermally connecting the plural fins to an electronic component; and a covering portion that covers at least a portion of a bottom portion of a groove between the plural fins.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 18 is a side face cross-section of a first mold for manufacturing an electronic device according to a third exemplary embodiment.

DESCRIPTION OF EMBODIMENTS

First Exemplary Embodiment

Explanation follows regarding a first exemplary embodiment of technology disclosed herein.

Figure 1:
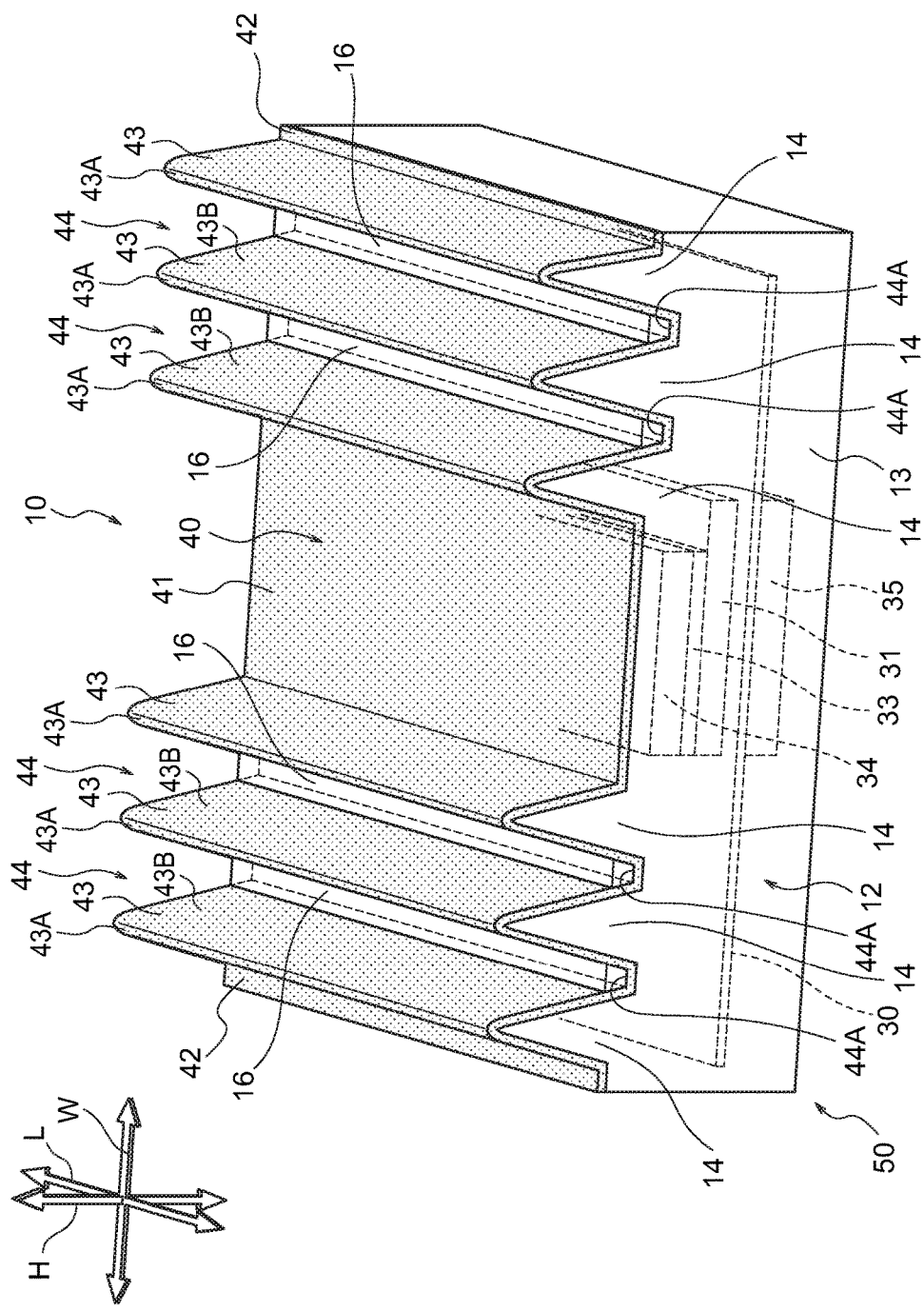
FIG. 1 is a perspective view of an electronic device according to a first exemplary embodiment.
Figure 2:
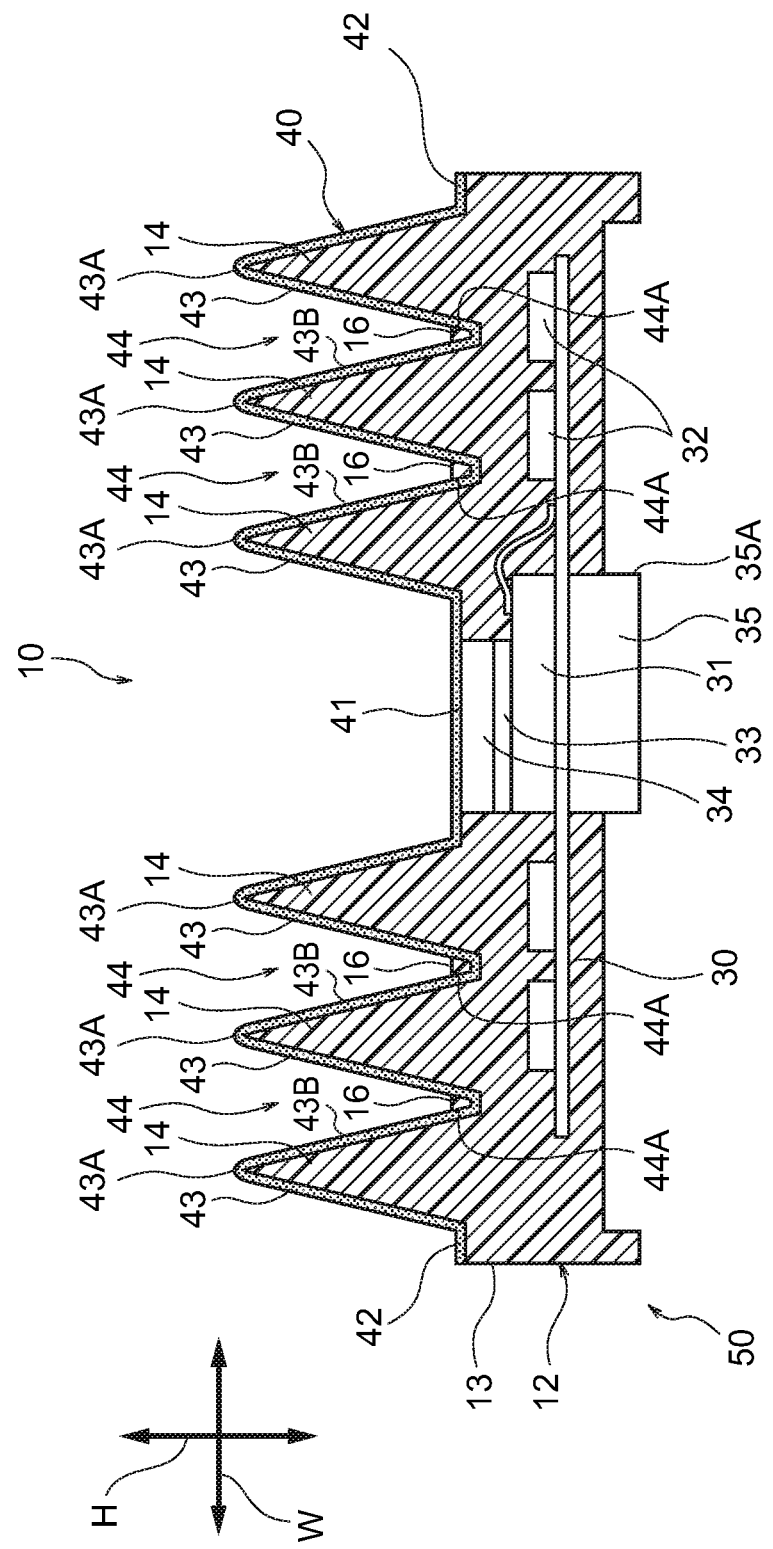
FIG. 2 is a cross-section as viewed from the front of an electronic device according to the first exemplary embodiment.

As illustrated in FIG. 1 and FIG. 2, an electronic device 10 according to the first exemplary embodiment includes a main body 12, a substrate 30, and a heat dissipating sheet 40.

In each of the drawings, the arrow W, the arrow L, and the arrow H respectively indicate the width direction, length direction, and height direction of the electronic device 10. The width direction, length direction, and height direction of the electronic device 10 are referred to as the width W direction, the length L direction, and the height H direction.

The main body 12 includes a flat cuboidal base 13, and plural protrusions 14 that project out from the base 13 toward the upper side in the height H direction. The main body 12 is formed by molding as described below, and is formed from resin (for example, polyamide resin), which is an example of a "first material".

The substrate 30 is formed as a flat plate, and is disposed with its thickness direction in the height H direction. Packaged components that include a thermoelectric element 31 serving as an example of an "electronic component", and a communication component 32 serving as an example of a "communication section", a packaged on the substrate 30. The packaged components of the substrate 30, including the thermoelectric element 31, the communication component 32, and the like, are connected together by a circuit pattern formed on the substrate 30. As illustrated in FIG. 2, the packaged components such as the thermoelectric element 31 and the communication component 32, and the substrate 30 are encapsulated by the resin base 13 of the main body 12.

A heat dissipating face of the thermoelectric element 31 is thermally connected to a connecting portion 41 of the heat dissipating sheet 40, described below, through a connecting member 33 and a heat spreader 34. A heat conducting member 35 is disposed at a heat absorbing face side of the thermoelectric element 31. The heat conducting member 35 is thermally connected to the heat absorbing face of the thermoelectric element 31. A portion 35A at the opposite side of the heat conducting member 35 to the thermoelectric element 31 projects out from a bottom face of the main body 12, and is exposed to the exterior.

The heat dissipating sheet 40 is formed from a second material having higher thermal conductivity than the first material that forms the main body 12. In the first exemplary embodiment, the material that forms the heat dissipating sheet 40 is graphite (carbon) as an example. The heat dissipating sheet 40 is provided at the height H direction upper side of the main body 12 and covers the main body 12 from the height H direction upper side.

The connecting portion 41 is formed at a width W direction central portion of the heat dissipating sheet 40 and is thermally connected to the thermoelectric element 31 described above, and an edge portion 42 is formed at both width W direction end portions of the heat dissipating sheet 40. The connecting portion 41 and the edge portions 42 are formed with their thickness directions in the height H direction. The positions (heights) of the connecting portion 41 and the edge portions 42 in the height H direction are, as an example, aligned with each other.

At both sides of the connecting portion 41, the heat dissipating sheet 40 is formed with plural bent fins 43. The plural fins 43 are formed with their height directions in the height H direction. Each of the fins 43 has a pointed shape (a shape with an isosceles triangle-shaped cross-section) that narrows in width on progression toward an apex 43A. The plural fins 43 are, as an example, aligned at the same height.

As illustrated in FIG. 1, the plural fins 43 formed at one side or another side of the heat dissipating sheet 40 in the width W direction are arrayed in the width W direction, and the length direction of each of the fins 43 extends in the length L direction. The length L direction, this being the direction in which the fins 43 extend, is an example of a "direction intersecting a direction in which plural fins are arrayed". As an example of being thermally connected at positions other than apexes, one fin 43 and another fin 43 are connected by a bottom portion 44A.

Grooves 44 having V-shaped cross-sections are formed between the plural fins 43. The inner side of the fins 43 and the grooves 44 are each open in the length L direction, this being the length direction of each of the fins 43. The heat dissipating sheet 40 including the plural fins 43, the connecting portion 41, and the edge portions 42 is, for example, formed by pressing. A resin that forms the protrusions 14 is filled into the inner side of the fins 43, and the fins 43 are supported by the protrusions 14 from the inner side of the fins 43.

The electronic device 10 is further provided with covering portions 16. The covering portions 16 are formed from the same material as the main body 12, and cover the entirety of the bottom portions 44A of the grooves 44 formed between the plural fins 43. Coupling portions 19 (see FIG. 8) are formed between the main body 12 and the covering portions 16 during molding, described below, and the main body 12 and the covering portions 16 are integrally formed through the coupling portions 19. In FIG. 1, the coupling portions 19 (see FIG. 8) are omitted from illustration in order to facilitate understanding of the internal structure of the electronic device 10.

The main body 12 and the covering portions 16 are made of resin, and are integrated with the heat dissipating sheet 40 by molding. The covering portions 16 are formed in long thin plate shapes and are provided to the bottom portion 44A sides of the grooves 44. Portions of side face portions 43B of the fins 43 on the apex 43A sides of the fins 43 with respect to the covering portions 16 are exposed to the exterior due to the covering portions 16 being thinly formed.

In the electronic device 10 according to the first exemplary embodiment, a structure that remains after the thermoelectric element 31, the connecting member 33, the heat spreader 34, the heat conducting member 35, and the substrate 30 have been removed from the electronic device 10 forms a heat dissipating component 50. Namely, the heat dissipating component 50 includes the main body 12, the heat dissipating sheet 40, and the plural covering portions 16.

Next, explanation follows regarding a manufacturing method for the electronic device 10 including the heat dissipating component 50 according to the first exemplary embodiment.

Figure 3:
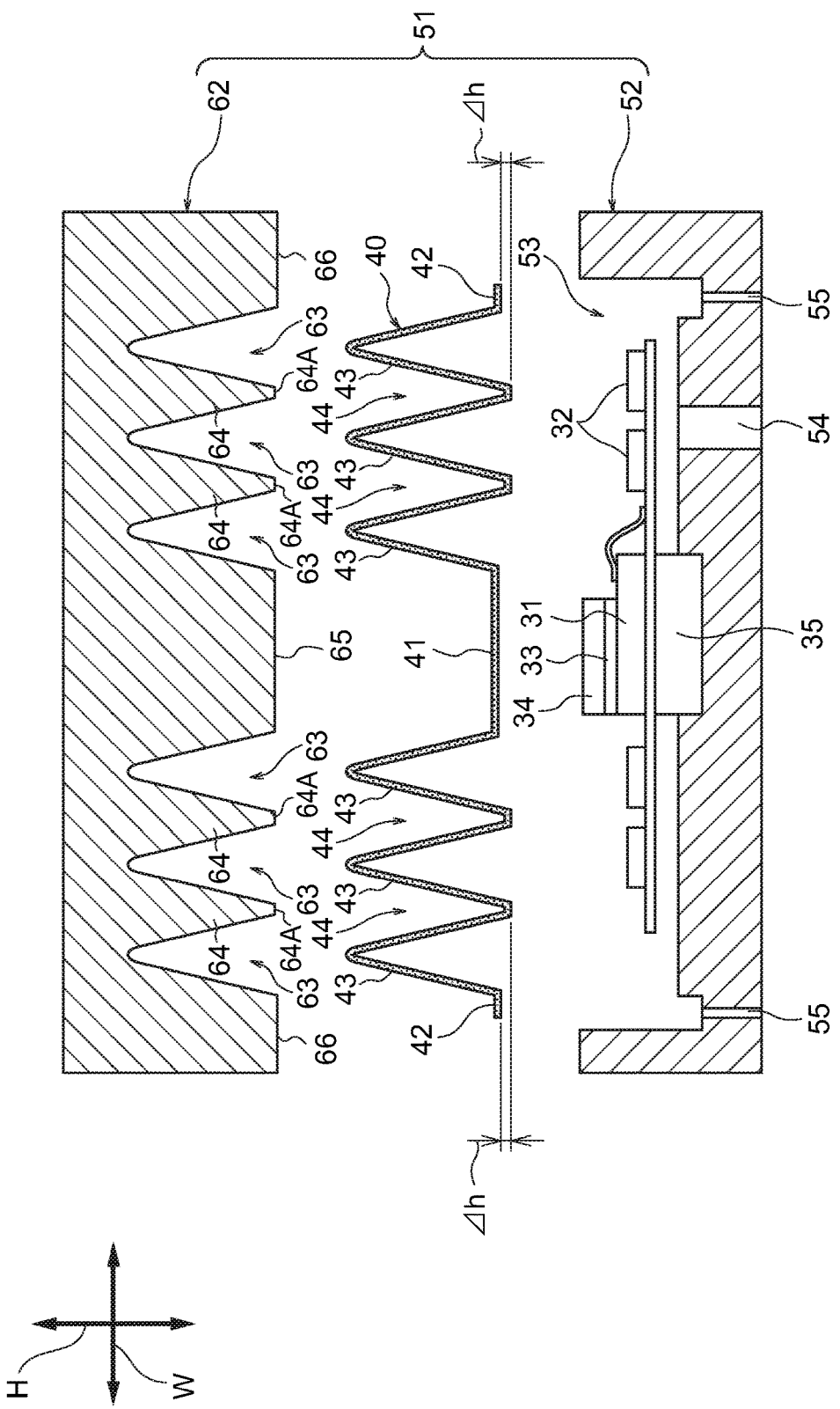
FIG. 3 is a diagram for explaining a manufacturing method for an electronic device according to the first exemplary embodiment.

The electronic device 10 illustrated in FIG. 1, as an example, is manufactured using a mold 51 illustrated in FIG. 3. The mold 51 includes a first mold 52 and a second mold 62. As an example, the first mold 52 is a fixed mold, and the second mold 62 is a movable mold.

A first cavity 53 is formed in the first mold 52 indented toward the lower side in the height H direction. The first cavity 53 has depth equivalent to the height of the base 13 (see FIG. 1). The substrate 30, onto which the thermoelectric element 31, the communication component 32, the connecting member 33, the heat spreader 34, the heat conducting member 35, and the like are mounted, is housed in the first cavity 53. Injection ports 54 for injecting resin into the mold 51, and exhaust outlets 55 for removing air from the mold 51 are formed in the first mold 52. As an example, the injection ports 54 are open toward the inner side of plural second cavities 63 formed in the second mold 62, described below.

Plural of the second cavities 63 are formed in the second mold 62 in a row in the width W direction, indented toward the upper side and the height H direction. Each of the second cavities 63 is formed to match the outer profile and size of of the plural fins 43 formed on the heat dissipating sheet 40, described above, and is formed with an inverted V-shaped cross-section. The heat dissipating sheet 40 is attached to the second mold 62, and the plural fins 43 are housed in the plural second cavities 63. Pointed portions between the plural second cavities 63 are formed as projections 64 that project out toward the first mold 52 side, and that are inserted into the grooves 44 between the plural fins 43.

Figure 4:
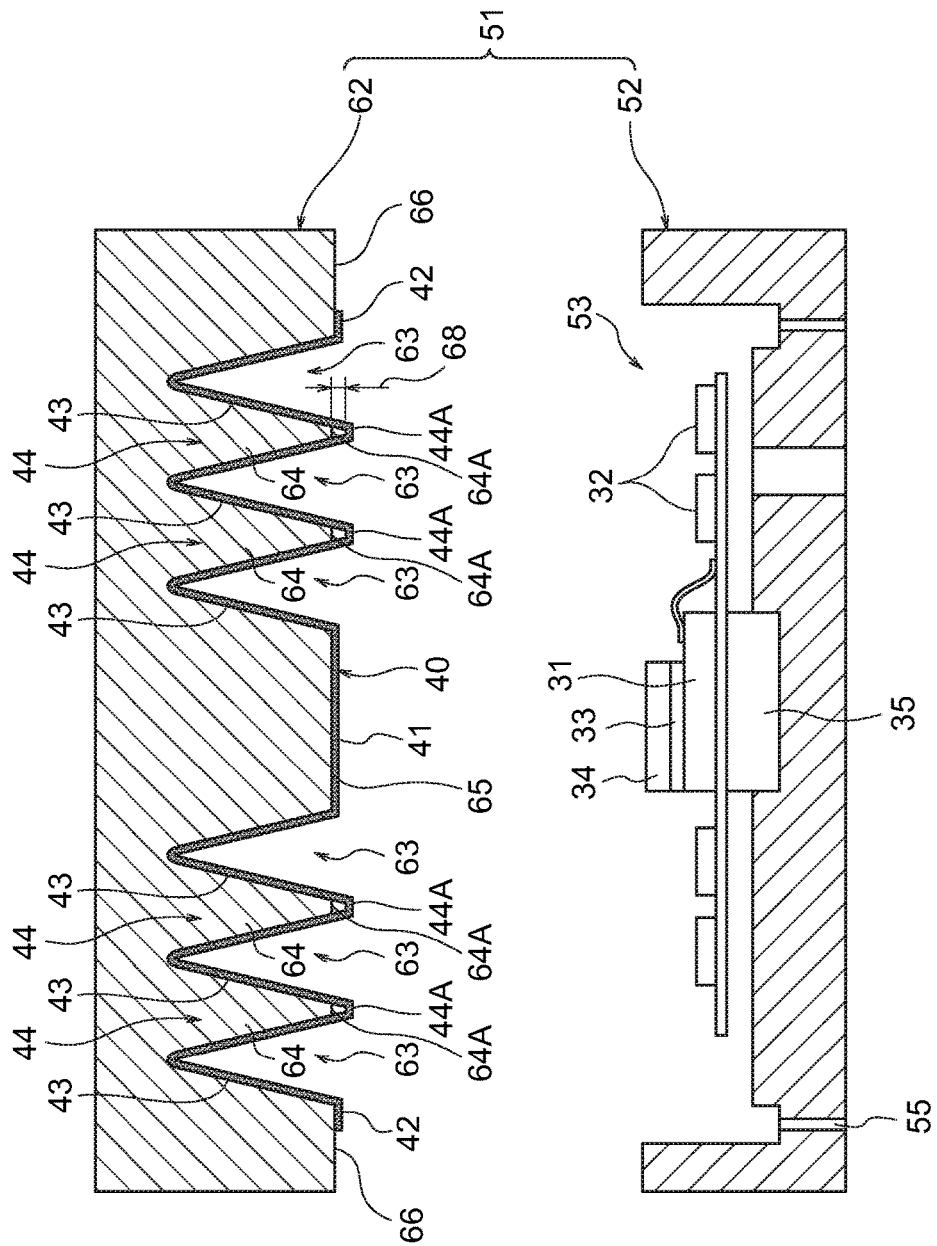
FIG. 4 is a diagram for explaining a manufacturing method for an electronic device according to the first exemplary embodiment.

Out of the lower faces of the second mold 62 at the first mold 52 side of the second mold 62, opposing faces 65, 66 that oppose the connecting portion 41 and the edge portions 42 are, as an example, aligned at the same height. As illustrated in FIG. 4, the opposing faces 65, 66 respectively abut the connecting portion 41 and the edge portions 42 in a state in which the heat dissipating sheet 40 is attached to the second mold 62. The bottom portions 44A of the grooves 44 formed in the heat dissipating sheet 40 are at a lower position in the depth direction of the grooves 44 (the height H direction) than the connecting portion 41 and the edge portions 42, and gaps 68 are formed between leading end portions 64A of the projections 64 inserted into the grooves 44 and the bottom portions 44A.

Figure 5:
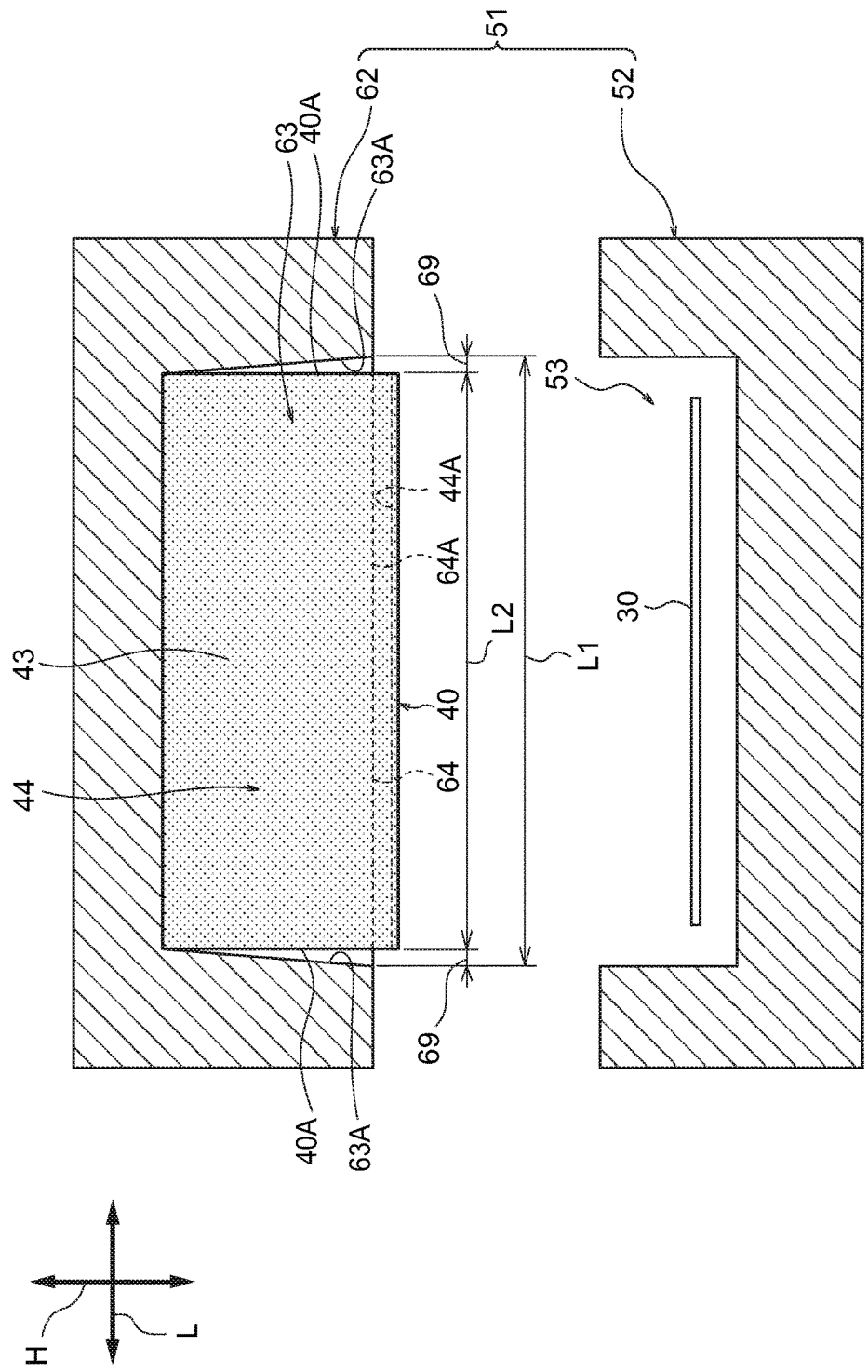
FIG. 5 is a diagram for explaining a manufacturing method for an electronic device according to the first exemplary embodiment.
Figure 6:
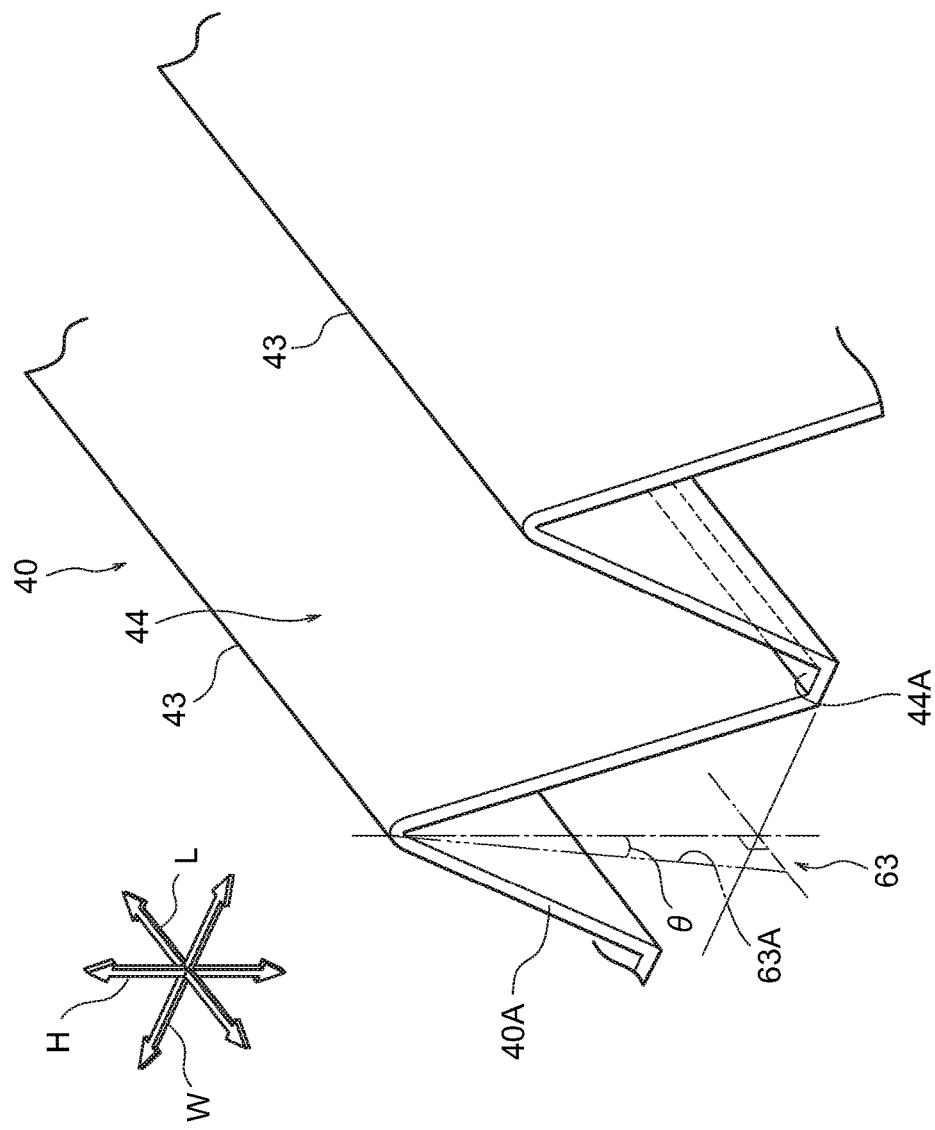
FIG. 6 is a partial enlarged perspective view of a heat dissipating sheet according to the first exemplary embodiment.

As illustrated in FIG. 5, length L direction end portions 40A of the heat dissipating sheet 40 extend in a straight line along the height H direction in a state in which the heat dissipating sheet 40 is attached to the second mold 62. In contrast thereto, length L direction side faces 63A of the second cavities 63 are inclined with respect to the height H direction so as to approach the length L direction end sides on progression toward the height H direction lower side. Namely, as illustrated in FIG. 6, the side faces 63A in the length L direction of the second cavities 63 have an inclination angle θ with respect to the height H direction. The inclination angle θ (taper) of the second cavities 63 is provided to facilitate removal of molded articles from the second cavities 63.

As illustrated in FIG. 5, due to the incline of the side faces 63A of the second cavities 63 in the length L direction, a length L2 of the heat dissipating sheet 40 in the length L direction is shorter than a length L1 of the first cavity 53 and the second cavities 63 in the length L direction for forming the main body 12. The length L1 of the second cavities 63 in the length L direction is equivalent to the opening width of the second cavities 63 at the first mold 52 side and the opening width of the first cavity 53 at the second mold 62 side.

The electronic device 10 is manufactured under the following principles using the above mold 51.

First, as illustrated in FIG. 4, the substrate 30, on which the thermoelectric element 31, the communication component 32, the connecting member 33, the heat spreader 34, the heat conducting member 35, and the like are mounted, is housed in the first cavity 53 in the first mold 52. The heat dissipating sheet 40, in which the plural bent fins 43 have been formed in advance by pressing, is housed in the second cavities 63 in the second mold 62.

As illustrated in FIG. 5, the heat dissipating sheet 40 is formed in advance such that the length L2 in the length L direction is shorter than the length L1 of the first cavity 53 and the second cavities 63 in the length L direction. Moreover, as illustrated in FIG. 4, the bottom portions 44A are positioned at lower positions in the depth direction of the grooves 44 (the height H direction) than the leading end portions 64A of the projections 64 of the second mold 62 inserted into the grooves 44, and the gaps 68 are formed between the leading end portions 64A of the projections 64 and the bottom portions 44A.

Figure 7:
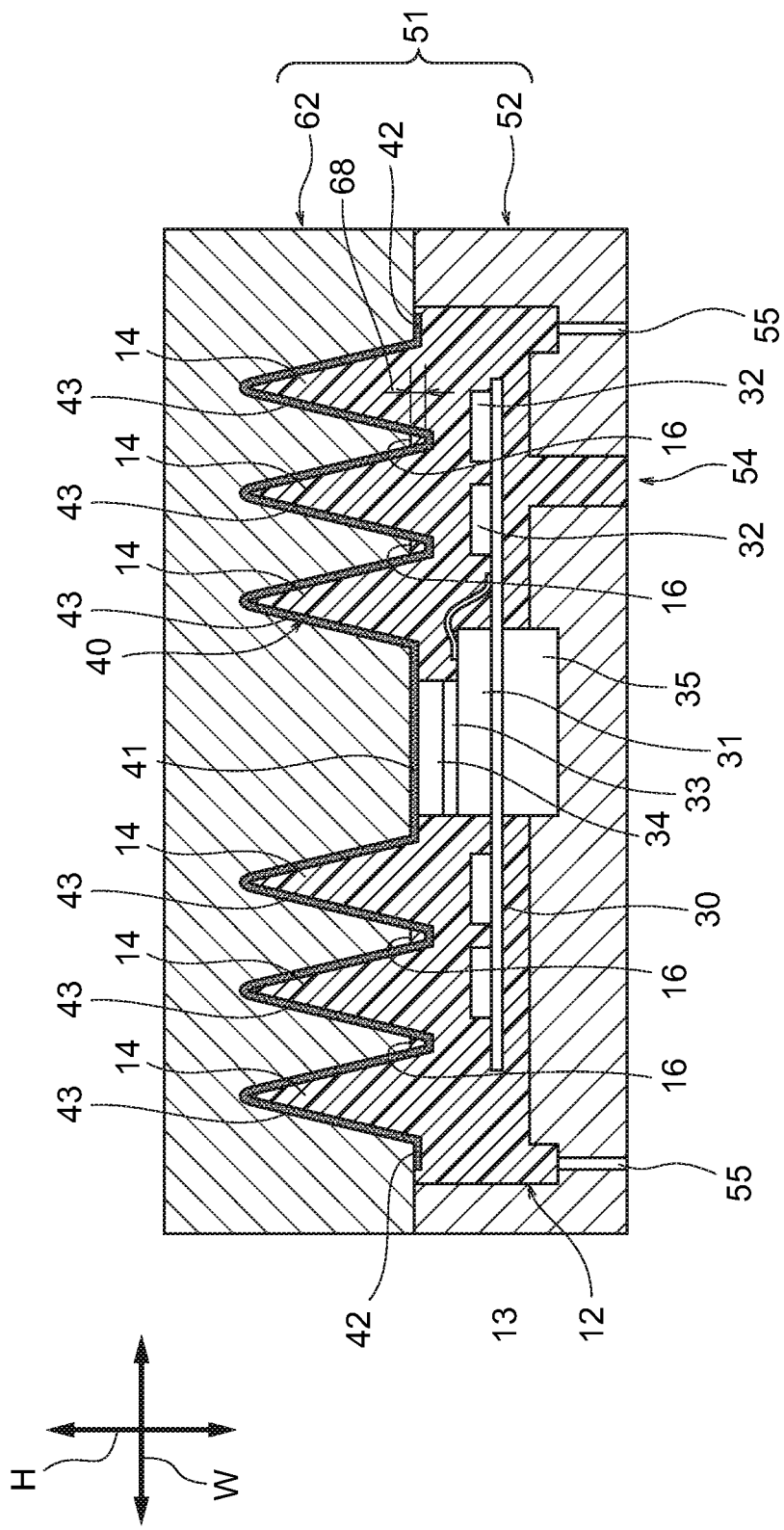
FIG. 7 is a diagram for explaining a manufacturing method for an electronic device according to the first exemplary embodiment.

Then, in a state in which the heat dissipating sheet 40 and the substrate 30 are thus set up in the mold 51, the first mold 52 and the second mold 62 are assembled together as illustrated in FIG. 7. The state in which the first mold 52 and the second mold 62 are assembled together in this manner is an example of a "set state".

Next, resin, which is an example of a "first material", is injected in a molten state into the mold 51, toward the inner side of the fins 43 through the injection ports 54. The resin injected into the mold 51 flows from the inner side of the fins 43 toward the apexes 43A of the fins 43 as indicated by the arrows A in FIG. 8, and is filled into the inner side of the fins 43. The fins 43 bulge and adhere to inner faces of the second cavities 63 due to the resin being filled into the inner side of the fins 43. Note that through-holes that allow the resin to pass may be formed in the substrate 30 to facilitate the in-flow of the resin injected into the mold 51 toward the inner side of the fins 43.

Figure 8:
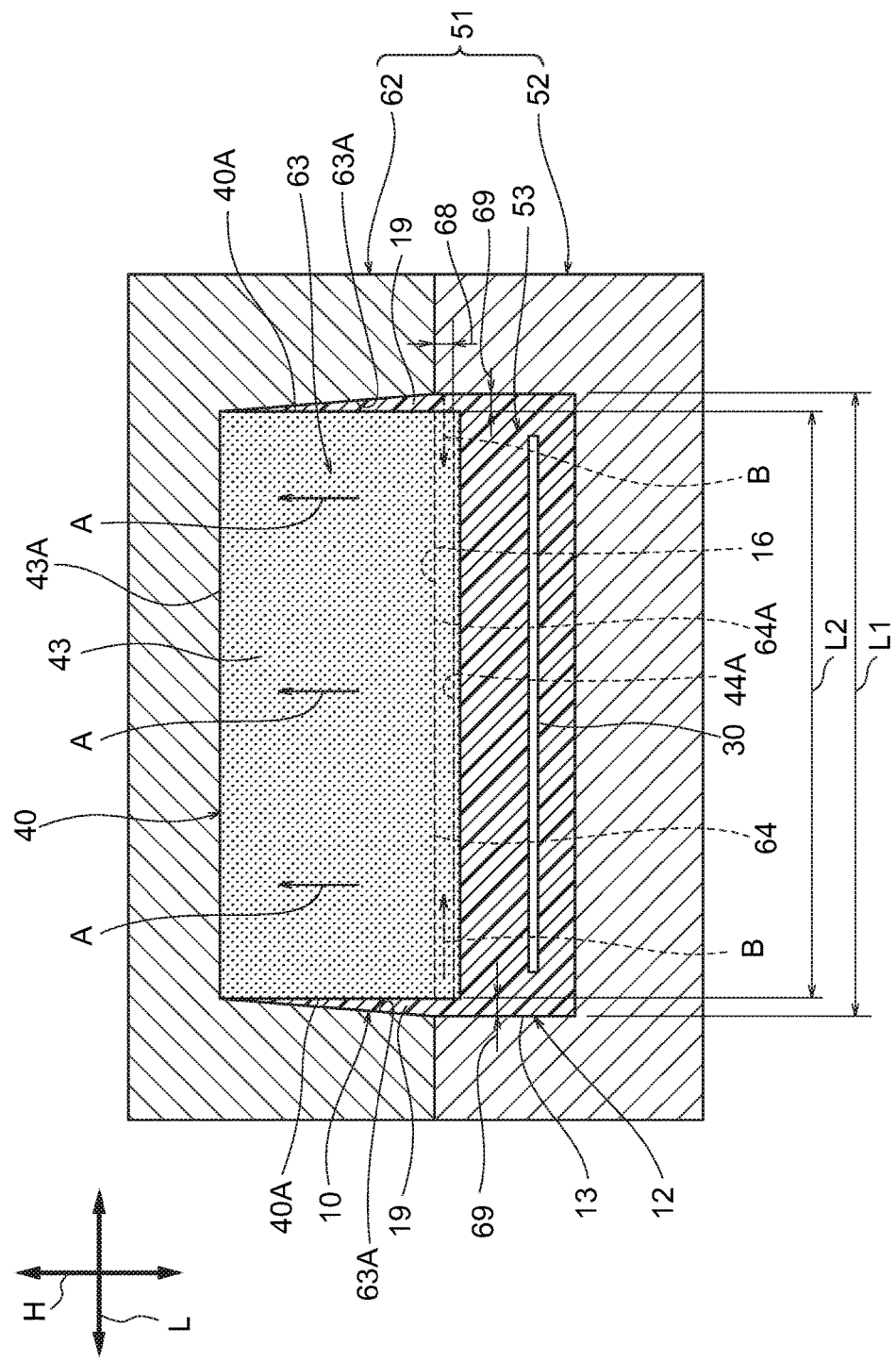
FIG. 8 is a diagram for explaining a manufacturing method for an electronic device according to the first exemplary embodiment.

As illustrated in FIG. 8, resin that has reached the apexes 43A of the fins 43 rebounds off the apexes 43A, and flows to end portions at both length L direction sides of the fins 43. The resin that has flowed to the end portions at both length direction sides of the fins 43 flows out to the outside of the fins 43 through the openings inner side the fins 43 at both length L direction sides thereof. The resin that has flowed out to the outside of the fins 43 passes through gaps 69 between the length L direction end portions 40A of the heat dissipating sheet 40 and the side faces 63A of the second cavities 63 and fills the gaps 68 between the leading end portions 64A of the projections 64 and the bottom portions 44A as indicated by the arrows B in FIG. 8. The gaps 68 are set with appropriate dimensions for the material and temperature of the molten resin.

Next, the mold 51 is cooled. The mold 51 may be cooled naturally, or may be force cooled by cycling cold water supplied from outside through a water-cooling pipe provided to the mold 51.

Then, as illustrated in FIG. 7, the resin that was filled into the mold 51 in the above-described manner is cooled and solidified to form the base 13, the plural protrusions 14, and the plural covering portions 16. Namely, the base 13 that encapsulates the thermoelectric element 31, the substrate 30, and the like is formed by the resin filled into the first cavity 53 of the first mold 52, and the protrusions 14 that support the fins 43 are formed by the resin filled into the inner side of the fins 43. Moreover, the covering portions 16 that cover the entirety of the bottom portions 44A are formed by the resin filled into the gaps 68 between the leading end portions 64A of the projections 64 of the second mold 62 and the bottom portions 44A.

In the electronic device 10 manufactured in this manner, as illustrated in FIG. 8, the coupling portions 19 are formed by the resin filled into the gap 69 between the length L direction end portions 40A of the heat dissipating sheet 40 and the side faces 63A of the second cavities 63. The main body 12 and the covering portions 16 are integrally formed through the coupling portions 19. The coupling portions 19 cover the heat dissipating sheet 40 from both length L direction sides, and extend from the main body 12 toward the apexes 43A of the fins 43.

The main body 12 and the covering portions 16 are integrated with the heat dissipating sheet 40 by molding as described above. The length of the main body 12 in the length L direction is similar to the length L1 of the first cavity 53 and the second cavities 63 in the length L direction. The length L1 of the main body 12 in the length L direction is longer than the length L2 of the heat dissipating sheet 40 in the length L direction at the portions where the coupling portions 19 are formed to the main body 12. The electronic device 10 manufactured using the above principles is removed from the mold 51.

Next, explanation follows regarding operation and advantageous effects of the first exemplary embodiment.

As explained in detail above, the electronic device 10 according to the first exemplary embodiment integrally includes the main body 12 that is formed from resin by molding and the sheet shaped heat dissipating sheet 40 that is provided at the main body 12, as illustrated in FIG. 1 and FIG. 2. In the electronic device 10, the heat dissipating sheet 40 provided at the main body 12 handles heat dissipation, rather than the main body 12, which is formed from a resin having lower thermal conductivity. The heat dissipating sheet 40 is sheet-shaped, and therefore needs to be continuous in order to secure heat dissipation performance.

It is expected that foreign matter may collect in the grooves 44 formed in the heat dissipating sheet 40, depending on the environment in which the electronic device 10 according to the first exemplary embodiment is employed. In a comparative example for the first exemplary embodiment, supposing the electronic device 10 does not include the covering portions 16, the surface of the heat dissipating sheet 40 could be damaged by the forceful removal of foreign matter collected in the grooves 44. Damage to the surface of the heat dissipating sheet 40 hinders heat conduction at the damaged sites, and heat dissipation performance is reduced. In this manner, in cases lacking the covering portions 16, there is a risk that the heat dissipation performance of the heat dissipating sheet 40 will be reduced due to removal of foreign matter.

In contrast thereto, the bottom portions 44A of the grooves 44 are covered by the covering portions 16 in the electronic device 10 according to the first exemplary embodiment. Accordingly, even when foreign matter collected in the grooves 44 is removed using a cleaning tool such as a brush, contact between the cleaning tool and the bottom portions 44A is prevented, enabling damage to the surface of the bottom portions 44A to be suppressed. This enables reduction of the heat dissipation performance of the heat dissipating sheet 40 to be suppressed even when the heat dissipating sheet 40 is formed from, for example, a soft, easily damaged material.

In particular, the covering portions 16 enable damage to the surface of the bottom portions 44A to be suppressed across the entirety of each bottom portion 44A since the entirety of each bottom portion 44A is covered. This enables a reduction of the heat dissipation performance of the heat dissipating sheet 40 to be more effectively suppressed.

Moreover, the covering portions 16 are provided at the bottom portion 44A sides in the grooves 44, and portions of the side face portions 43B of the fins 43 on the apex 43A sides of the fins 43 with respect to the covering portions 16 are exposed to the exterior. Accordingly, since heat in the heat dissipating sheet 40 is dissipated at the portions of the side face portions 43B of the fins 43 on the apex 43A sides of the fins 43 with respect to the covering portions 16, the heat dissipation performance of the heat dissipating sheet 40 can be secured. Namely, although heat dissipation from the bottom portions 44A is suppressed by covering the bottom portions 44A with the covering portions 16, since the surface area of the bottom portions 44A is less than the surface area of the side face portions 43B of the fins 43, the influence provision of the covering portions 16 has on the heat dissipation performance of the heat dissipating sheet 40 can be suppressed.

Moreover, the electronic device 10 includes the sheet-shaped heat dissipating sheet 40 for heat dissipation. Accordingly, the electronic device 10 can be made more compact compared to configurations provided with a heat dissipating member such as a cast or machined article for heat dissipation.

The main body 12 integrated with the heat dissipating sheet 40 encapsulates the thermoelectric element 31, the substrate 30, and the like, and the thermoelectric element 31, the substrate 30, and the like can therefore be protected by the main body 12.

Moreover, since plural bent fins 43 are formed in the heat dissipating sheet 40, the surface area of the heat dissipating sheet 40 can be increased at the portions where the plural fins 43 are formed. This enables the heat dissipation performance of the heat dissipating sheet 40 to be improved.

Moreover, the protrusions 14 filled into the inner side of the fins 43 are formed in the main body 12, and the fins 43 are supported by the protrusions 14 from the inner side of the fins 43. Accordingly, the fins 43 can be suppressed from undergoing deformations such as breakage even when an external force is applied to the fins 43. This enables the heat dissipation performance of the heat dissipating sheet 40 to be maintained.

In the manufacturing method for an electronic device according to the first exemplary embodiment, the molding in which the thermoelectric element 31, the substrate 30, and the like are encapsulated by the main body 12, and the adhesion of the heat dissipating sheet 40 to the main body 12 are performed by the same process. Accordingly, there are fewer manufacturing processes than in cases in which the molding process in which the thermoelectric element 31, the substrate 30, and the like are encapsulated by the main body 12, and the adhesion process of the heat dissipating sheet 40 to the main body 12 are performed as separate processes. This enables the cost of the electronic device 10 to be reduced.

The main body 12 and the covering portions 16 are integrally formed by the molding. Likewise, this enables the cost of the electronic device 10 to be reduced compared to cases in which, for example, the main body 12 and the covering portions 16 are formed separately, since there are fewer manufacturing processes.

Next, explanation follows regarding example applications of the electronic device 10 according to the first exemplary embodiment.

Figure 9:
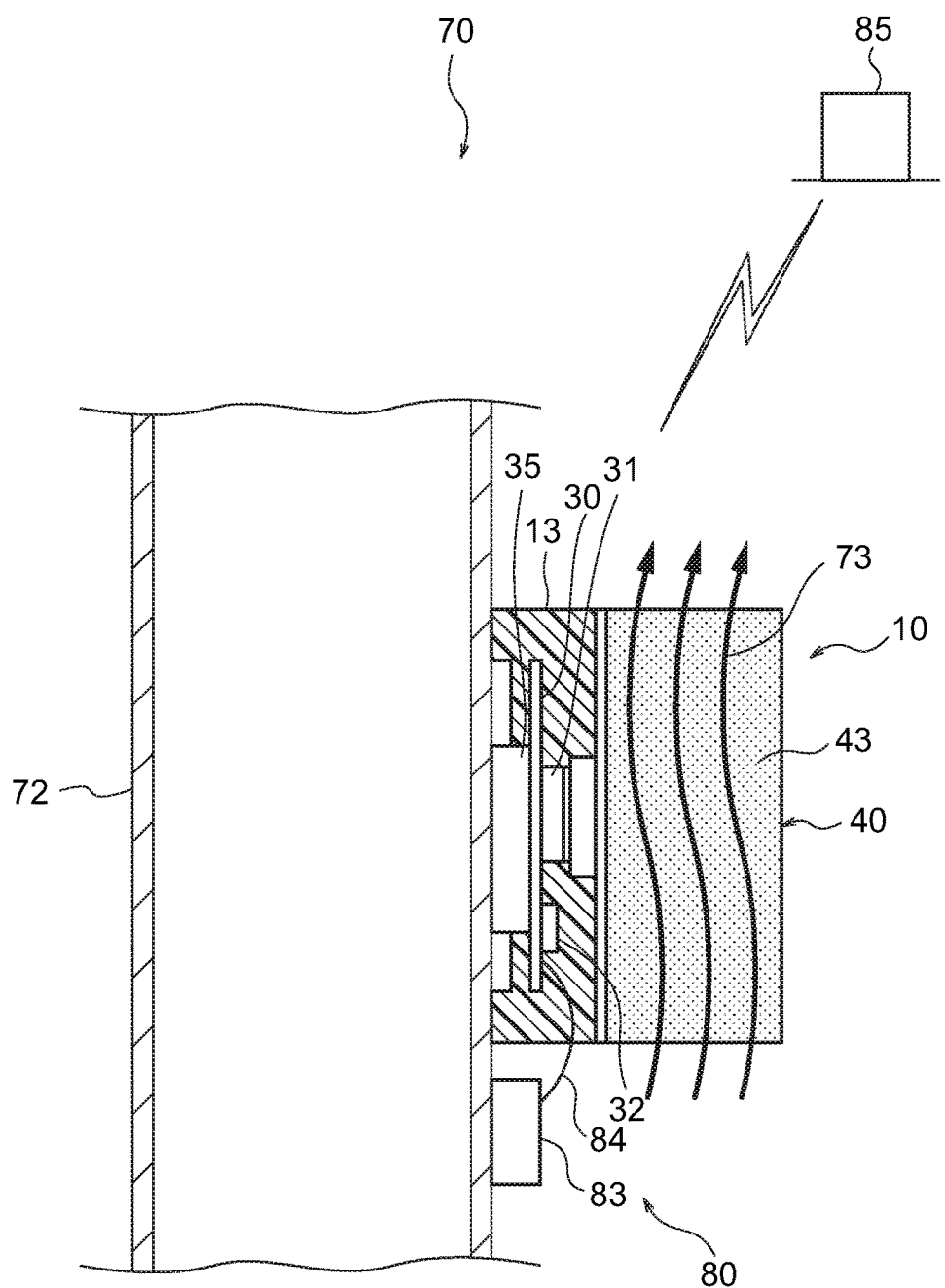
FIG. 9 is a diagram illustrating an information processing system according to the first exemplary embodiment.

As an example, an information processing system 70 illustrated in FIG. 9 is a system for managing temperature data of a pipe 72 having high temperature fluid flowing therein. The information processing system 70 includes an integrated module 80 and a server 85.

The integrated module 80 is installed on a surface of the pipe 72, which is an example of an "installation target". The integrated module 80 includes the electronic device 10 described above, and a sensor 83. In the integrated module 80, the thermoelectric element 31 of the electronic device 10 is an example of a "power supply section", and the sensor 83 is an example of a "detector". The thermoelectric element 31 is thermally connected to the pipe 72 via the heat conducting member 35. The sensor 83 is, for example, a thermosensor and is fixed to the surface of the pipe 72. The sensor 83 is connected to the substrate 30 via wiring 84.

In the integrated module 80, the temperature of the heat absorbing face of the thermoelectric element 31 thermally connected to the pipe 72 rises when the high temperature fluid flows inner side the pipe 72. However, the temperature of the heat dissipating face of the thermoelectric element 31 thermally connected to the heat dissipating sheet 40 is lowered when the fins 43 are exposed to, for example, external air such as an air current 73. Thus, when a temperature difference arises between the heat absorbing face and the heat dissipating face of the thermoelectric element 31, power is generated by the thermoelectric element 31.

Packaged components, including the communication component 32 and the like, packaged on the substrate 30, and the sensor 83, operate using power generated by the thermoelectric element 31. The sensor 83 outputs signals in accordance with the surface temperature of the pipe 72, and the communication component 32 transmits the data detected by the sensor 83 to the server 85. The server 85 receives and accumulates data transmitted from the integrated module 80. Note that an operation lamp indicating the operational state of the communication component 32 or the like may be provided to the integrated module 80.

In the information processing system 70, the surroundings of the pipe 72 reach a high temperature due to heat emitted by the pipe 72, and data can be transmitted from the integrated module 80 even in environments ill-suited to human entry, such as those with high levels of dust and grime. This enables the temperature state of the pipe 72 to be ascertained based on the data transmitted from the integrated module 80.

Next, explanation follows regarding a modified example of the first exemplary embodiment.

Although the electronic device 10 is formed as a sensor node-type integrated module combined with a sensor in the first exemplary embodiment, the electronic device 10 may be employed in applications other than that described above.

Although the electronic device 10 includes the thermoelectric element 31 as an example of an "electronic component", electronic components other than the thermoelectric element 31 may be included.

Although the main body 12 is formed using polyamide resin as an example of a "first material", the main body 12 may be formed from a resin other than polyamide resin.

Although the heat dissipating sheet 40 is formed using graphite as an example of a "second material", as long as this material has higher thermal conductivity than the material forming the main body 12, the heat dissipating sheet 40 may be formed from, for example, a metal such as aluminum or copper, or may be formed from a material other than a metal.

Figure 10:
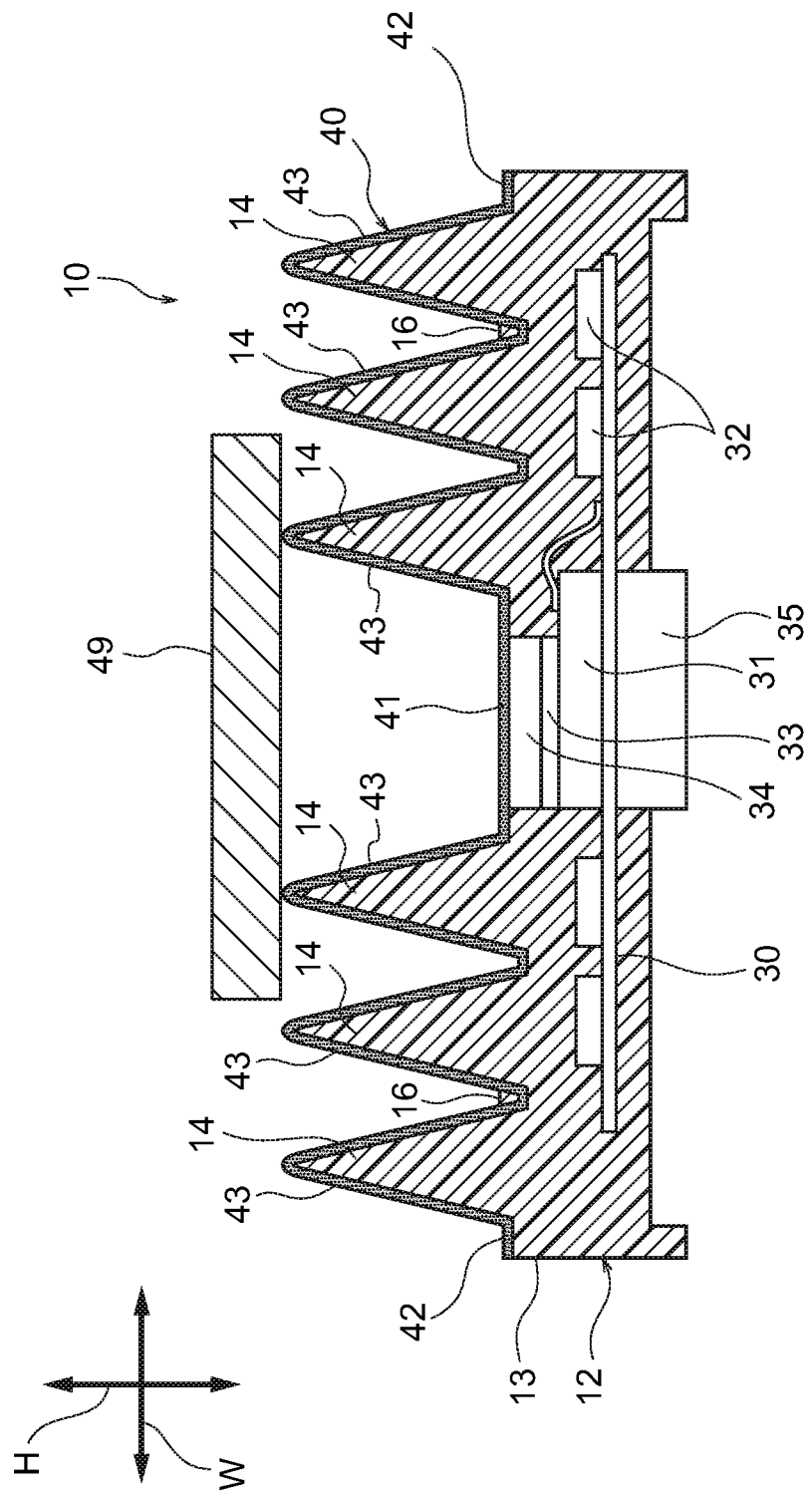
FIG. 10 is a cross-section as viewed from the front illustrating a first modified example of an electronic device according to the first exemplary embodiment.
Figure 11:
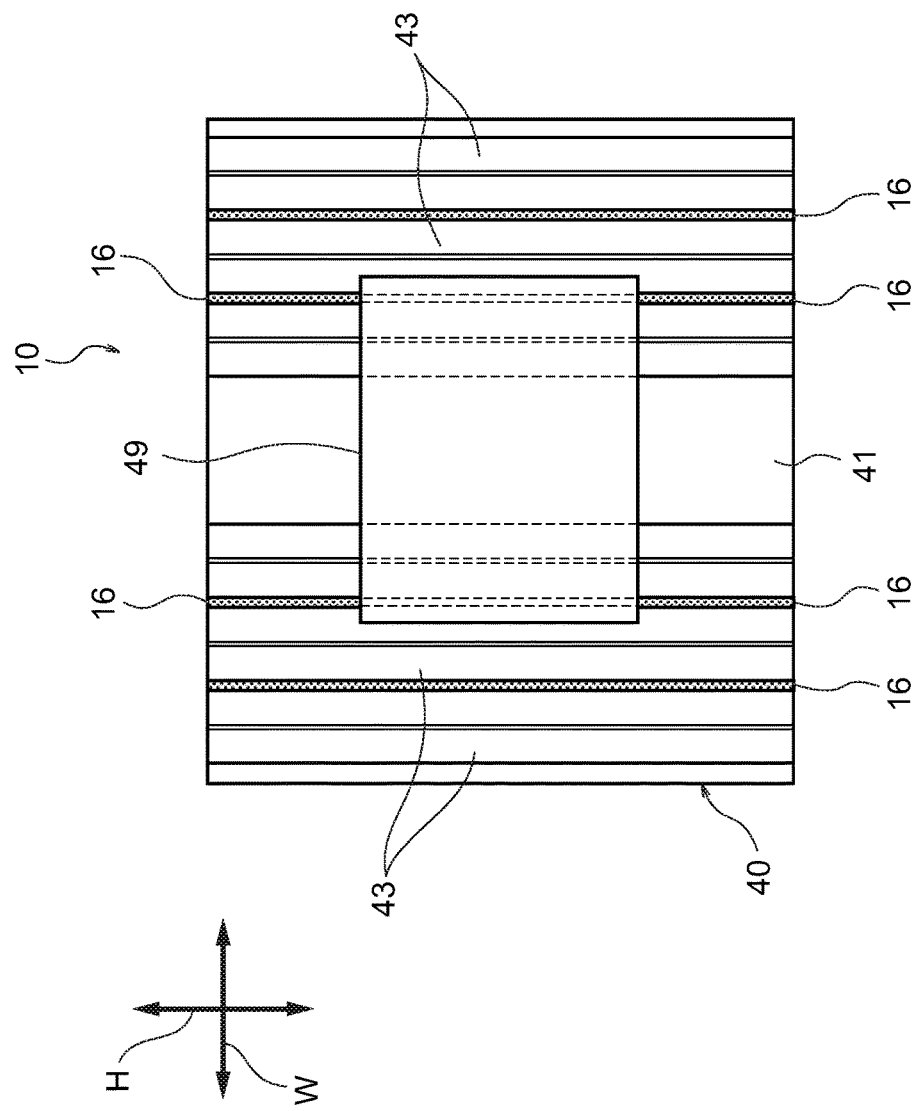
FIG. 11 is a plan view illustrating a first modified example of an electronic device according to the first exemplary embodiment.

Although the covering portions 16 cover the entirety of the bottom portions 44A, the covering portions 16 may be configured with a size and shape that covers a portion of the bottom portions 44A. For example, in the modified example illustrated in FIG. 10 and FIG. 11, a placement member 49 is disposed at the opposite side of the heat dissipating sheet 40 to the main body 12 (the upper side). Since foreign matter does not easily build up below the placement member 49, covering portions 16 are omitted below the placement member 49. Namely, the covering portions 16 are positioned at the outsides of the placement member 49 when the heat dissipating sheet 40 and the disposing member 49 are viewed along the height direction of the fins 43.

When thus configured, the exposed surface area of the heat dissipating sheet 40 increases by an amount corresponding to the portions where the covering portions 16 are not provided below the placement member 49, enabling the heat dissipation performance of the heat dissipating sheet 40 to be improved.

Although each of the fins 43 has a pointed shape (an isosceles triangle-shaped cross-section) that narrows in width on progression toward the apexes 43A in the first exemplary embodiment, the fins 43 may have another cross-section profile, such as a rectangle-shaped cross-section.

Although the electronic device 10 includes the thermoelectric element 31, the connecting member 33, the heat spreader 34, the heat conducting member 35, the substrate 30, and the heat dissipating component 50 integrated together in the first exemplary embodiment, the heat dissipating component 50 may be independent from the device body of the electronic device 10.

Figure 12:
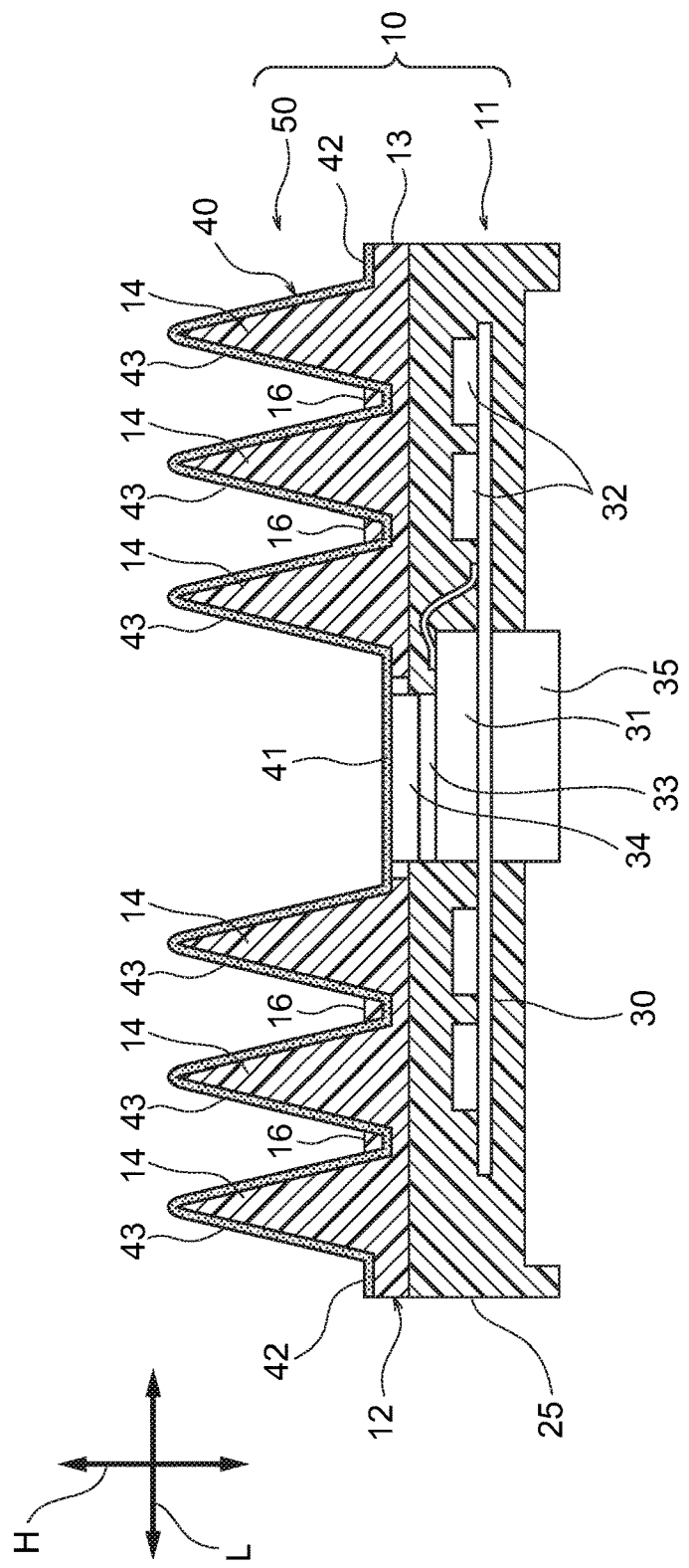
FIG. 12 is a cross-section as viewed from the front illustrating a second modified example of an electronic device according to the first exemplary embodiment.

For example, in the modified example illustrated in FIG. 12, a device body 11 is formed by the thermoelectric element 31, the connecting member 33, the heat spreader 34, the heat conducting member 35, the substrate 30, and an encapsulating resin 25 that encapsulates these components. The heat dissipating component 50 includes the main body 12, the heat dissipating sheet 40, and the plural covering portions 16, and is formed independently from the device body 11. In the modified example illustrated in FIG. 12, the heat dissipating component 50 is a molded article, and the heat dissipating component 50 can be provided at low cost, enabling the cost of the electronic device 10 to be reduced.

According to the first exemplary embodiment illustrated in FIG. 9, in the integrated module 80, the electronic device 10 may include a battery that stores power generated by the thermoelectric element 31. In such cases, the thermoelectric element 31 and the battery correspond to an example of a "power supply section". Moreover, the sensor 83 and the communication component 32 may operate using power from at least one out of the thermoelectric element 31 or the battery.

The information processing system 70 may be employed in applications other than the management of temperature data of the pipe 72 having high temperature fluid flowing therein.

Second Exemplary Embodiment

Next, explanation follows regarding a second exemplary embodiment according to technology disclosed herein.

In the second exemplary embodiment, the manufacturing method differs as follows from the manufacturing method for an electronic device according to the first exemplary embodiment described above. In the second exemplary embodiment, the electronic device is manufactured under the following principles.

Figure 13:
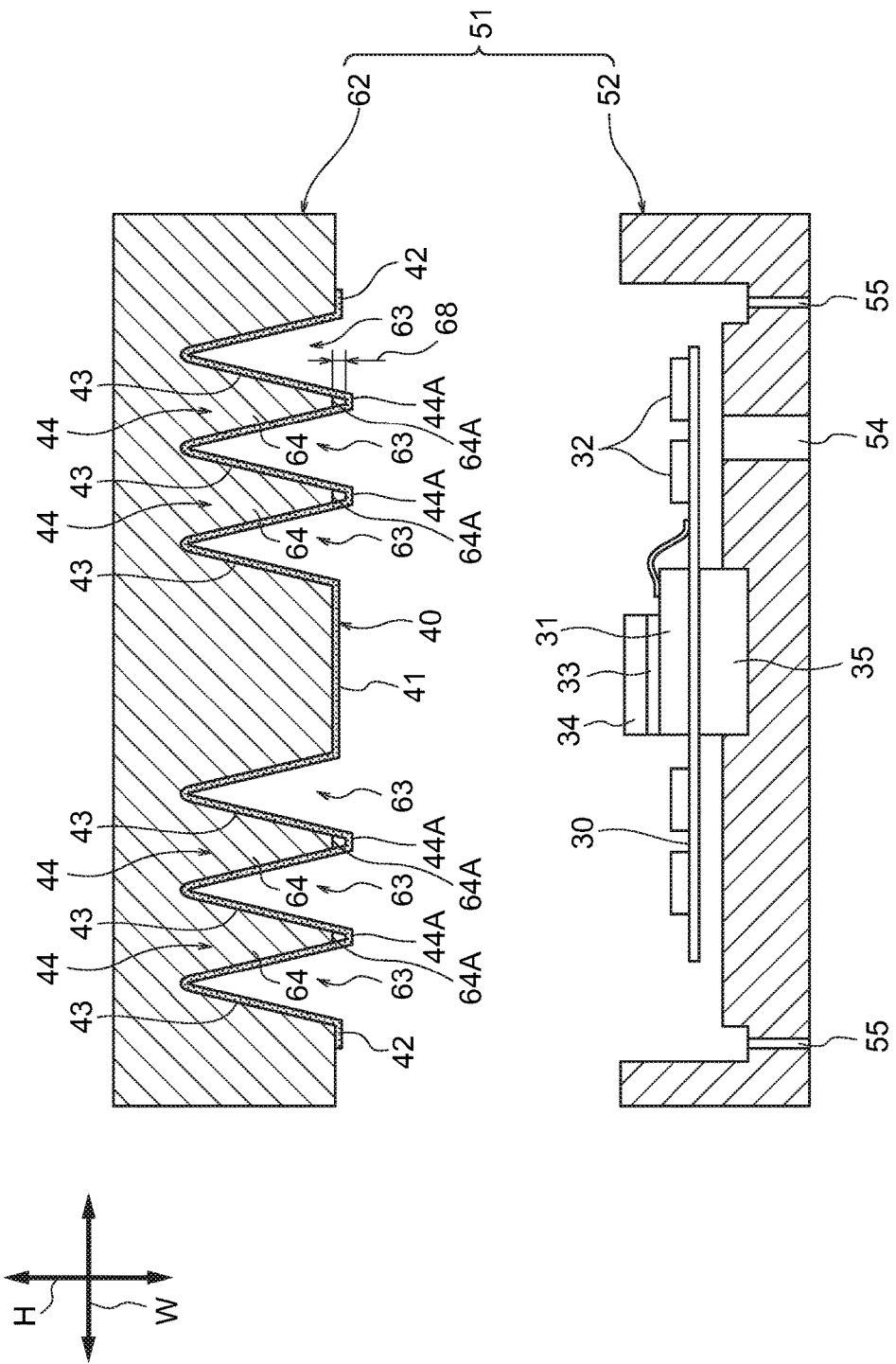
FIG. 13 is a diagram for explaining a manufacturing method of an electronic device according to a second exemplary embodiment.

First, as illustrated in FIG. 13, the substrate 30 is housed in the first cavity 53 inner side the first mold 52, and the heat dissipating sheet 40 is housed in the second cavities 63 inner side the second mold 62.

Figure 14:
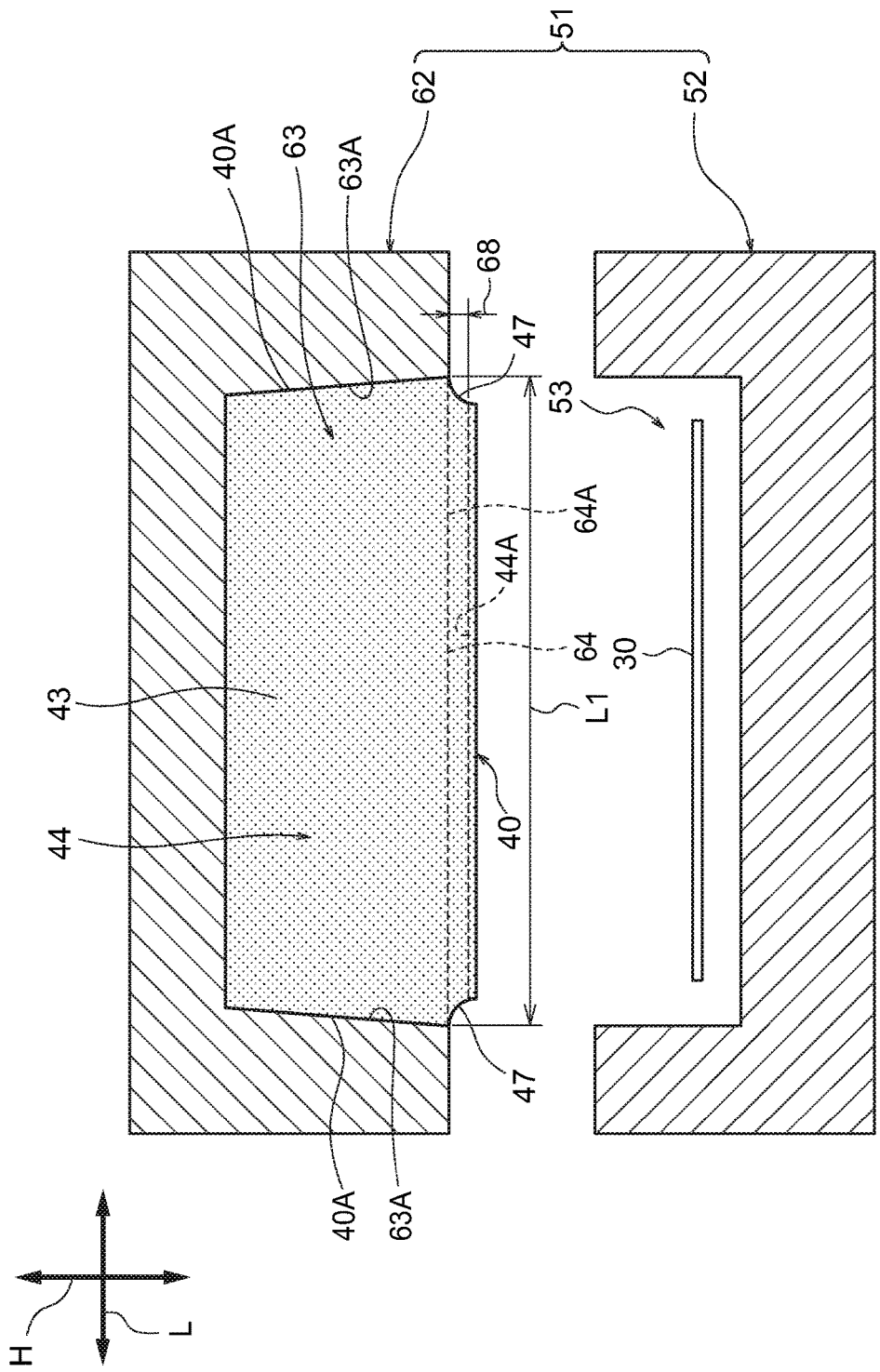
FIG. 14 is a diagram for explaining a manufacturing method of an electronic device according to the second exemplary embodiment.

As illustrated in FIG. 14, the heat dissipating sheet 40 is pre-formed so as to have a length along the length L direction that is equal to the length L1 of the first cavity 53 and the second cavities 63 in the length L direction. Namely, in the second exemplary embodiment, the length L direction end portions 40A of the heat dissipating sheet 40 are inclined with respect to the height H direction so as to approach the length L direction end sides on progression toward the height H direction lower side. Then, in a state in which the heat dissipating sheet 40 is attached to the second mold 62, the length L direction end portions 40A of the heat dissipating sheet 40 extend in a straight line along the side faces 63A in the length L direction of the second cavities 63.

Figure 15:
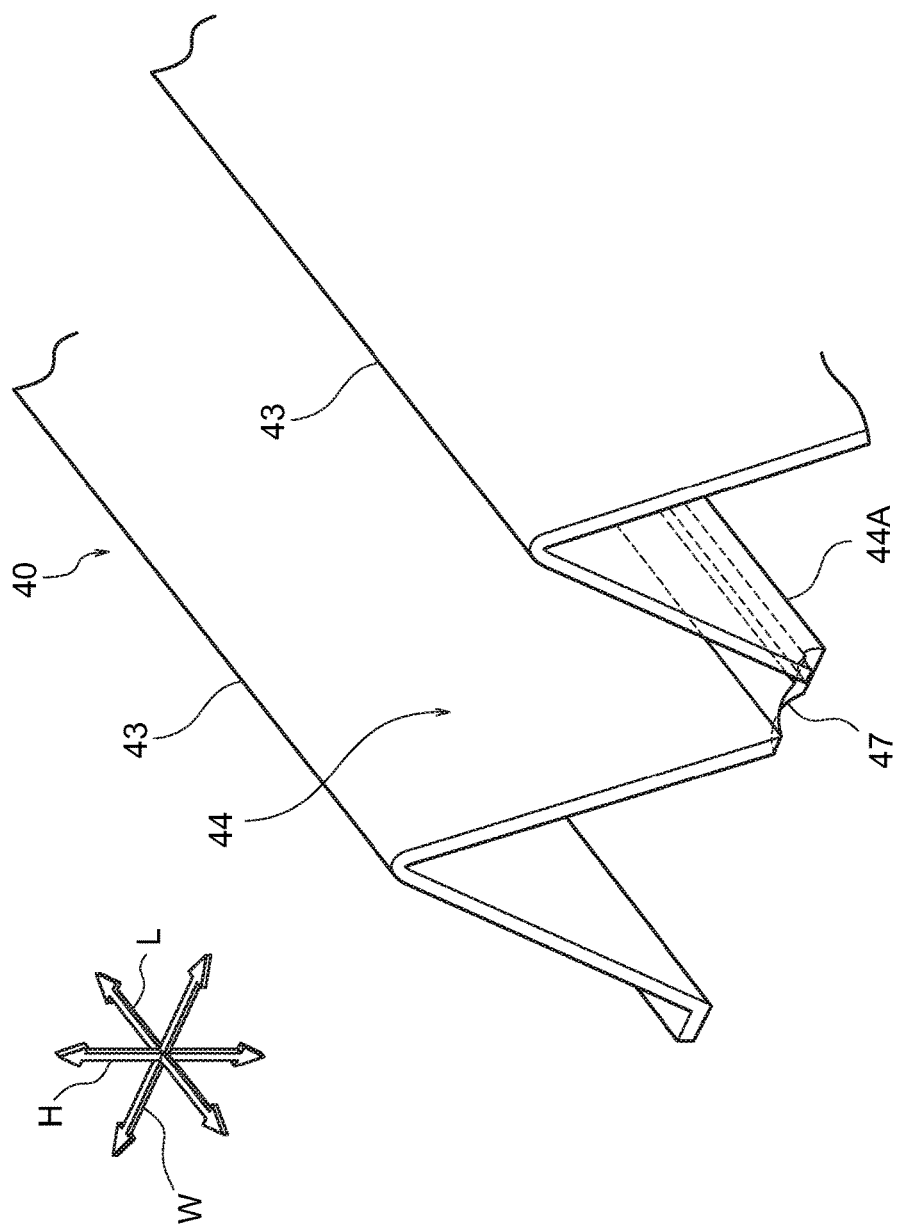
FIG. 15 is a partial enlarged perspective view of a heat dissipating sheet according to the second exemplary embodiment.

Moreover, the bottom portions 44A are formed in flat shapes, and are positioned at lower positions than the lower face of the second mold 62. As illustrated in FIG. 15, cut-outs 47 (also see FIG. 14), which are examples of an "inflow port", are pre-formed in both length direction side end portions of the bottom portions 44A of the heat dissipating sheet 40. The cut-outs 47 are formed when the heat dissipating sheet 40 is pressed. The cut-outs 47 penetrate through the thickness direction of the bottom portions 44A, and place the inner side of the fins 43 in communication with the grooves 44. The cut-outs 47 are cut out in a circular arc shape as an example.

As illustrated in FIG. 13, the bottom portions 44A are positioned at a lower position in the depth direction of the grooves 44 (the height H direction) than the leading end portions 64A of the projections 64 of the second mold 62 inserted into the grooves 44, and the gaps 68 are formed between the leading end portions 64A of the projections 64 and the bottom portions 44A. Then, in a state in which the heat dissipating sheet 40 and the substrate 30 are thus set up in the mold 51, the first mold 52 and the second mold 62 are assembled together.

Figure 16:
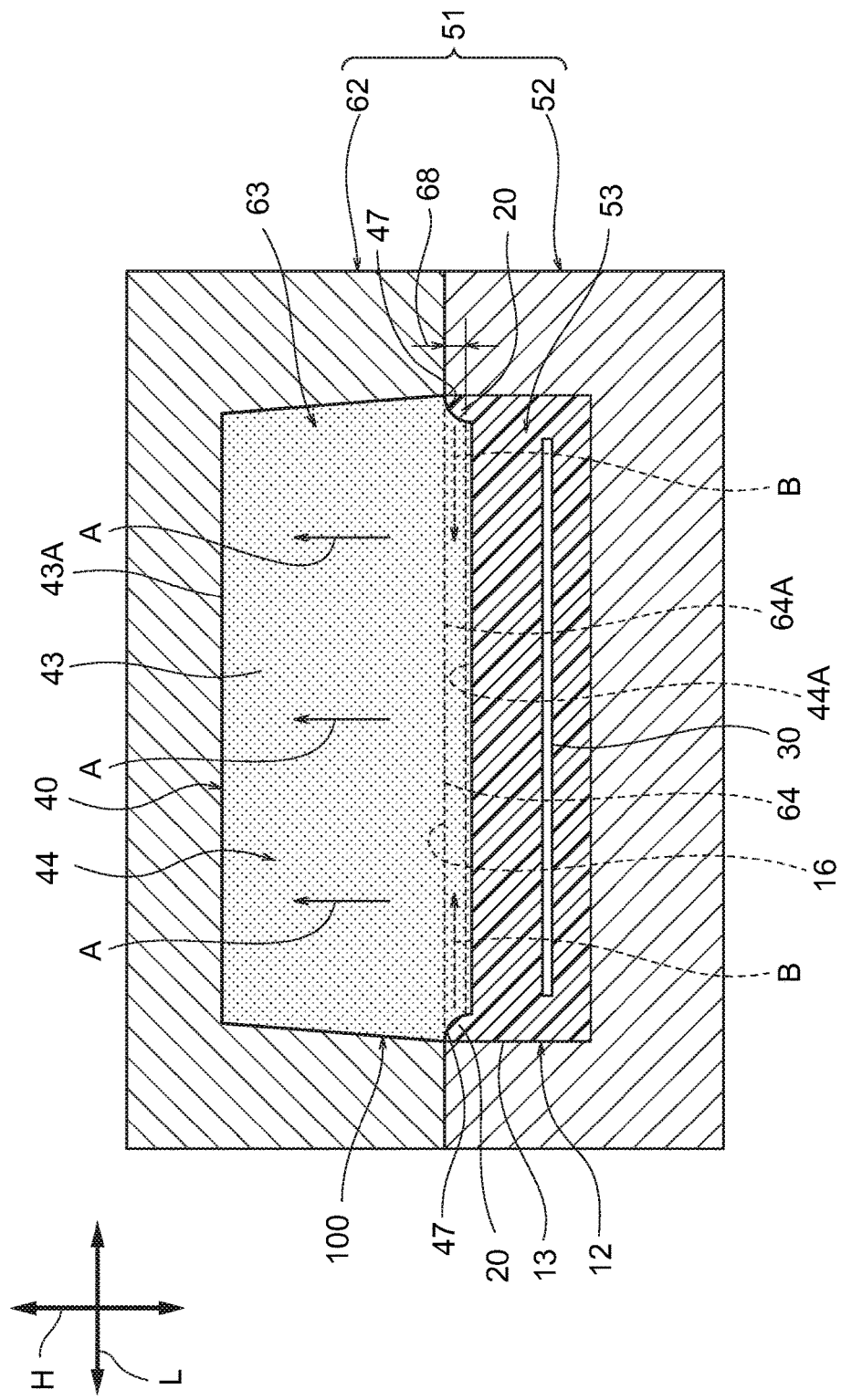
FIG. 16 is a diagram for explaining a manufacturing method of an electronic device according to the second exemplary embodiment.

Next, as illustrated in FIG. 16, resin, which is an example of a "first material", is injected into the mold 51 in a molten state. The resin injected into the mold 51 flows from the inner side of the fins 43 toward the apexes 43A of the fins 43 as indicated by the arrows A in FIG. 16, and is filled into the inner side of the fins 43. The fins 43 bulge and adhere to the inner faces of the second cavities 63 due to the resin being filled into the inner side of the fins 43.

Resin that has reached the apexes 43A of the fins 43 rebounds off the apexes 43A and flows to the end portions inner side the fins 43 at both length L direction sides thereof. The resin that has flowed to the end portions inner side the fins 43 at both length L direction sides thereof passes through the cut-outs 47 and fills the gaps 68 between the leading end portions 64A of the projections 64 and the bottom portions 44A as indicated by the arrows B in FIG. 16.

Then, resin filled into the mold 51 as described above is cooled and solidified to form the base 13, the plural protrusions 14, and the plural covering portions 16 (see FIG. 1, FIG. 2), similarly to in the first exemplary embodiment.

In the second exemplary embodiment, an electronic device 100 (see FIG. 16) is manufactured under the principles above. In the electronic device 100 manufactured in this manner, the main body 12 and the covering portions 16 are formed integrally through coupling portions 20 formed in the cut-outs 47. Moreover, the main body 12 and the covering portions 16 are integrated with the heat dissipating sheet 40 by molding as described above. In the second exemplary embodiment, the coupling portions 19 (see FIG. 8) are not formed.

In the manufacturing method for an electronic device according to the second exemplary embodiment too, the main body 12 and the covering portions 16 are integrally formed by molding similarly to in the first exemplary embodiment. Accordingly, there are fewer manufacturing processes than in cases in which, for example, the main body 12 and the covering portions 16 are formed separately. This enables the cost of the electronic device 10 to be reduced.

In the heat dissipating sheet 40 according to the second exemplary embodiment, the length L direction end portions 40A are inclined with respect to the height H direction so as to approach the length L direction end sides on progression toward the height H direction lower side. Accordingly, the surface area of the side face portions of the heat dissipating sheet 40 increases by an amount corresponding to the inclined portions, enabling the heat dissipation performance of the heat dissipating sheet 40 to be improved.

Although the cut-outs 47 of the heat dissipating sheet 40 are cut out in circular arc shapes in the second exemplary embodiment, a shape other than a circular arc may be cut out.

Additionally, in the second exemplary embodiment, in order to smooth the flow of resin passing through the cut-outs 47 and filling the gaps 68 between the leading end portions 64A of the projections 64 of the second mold 62 and the bottom portion 44A, the projections 64 of the second mold 62 may be formed as follows.

Figure 17:
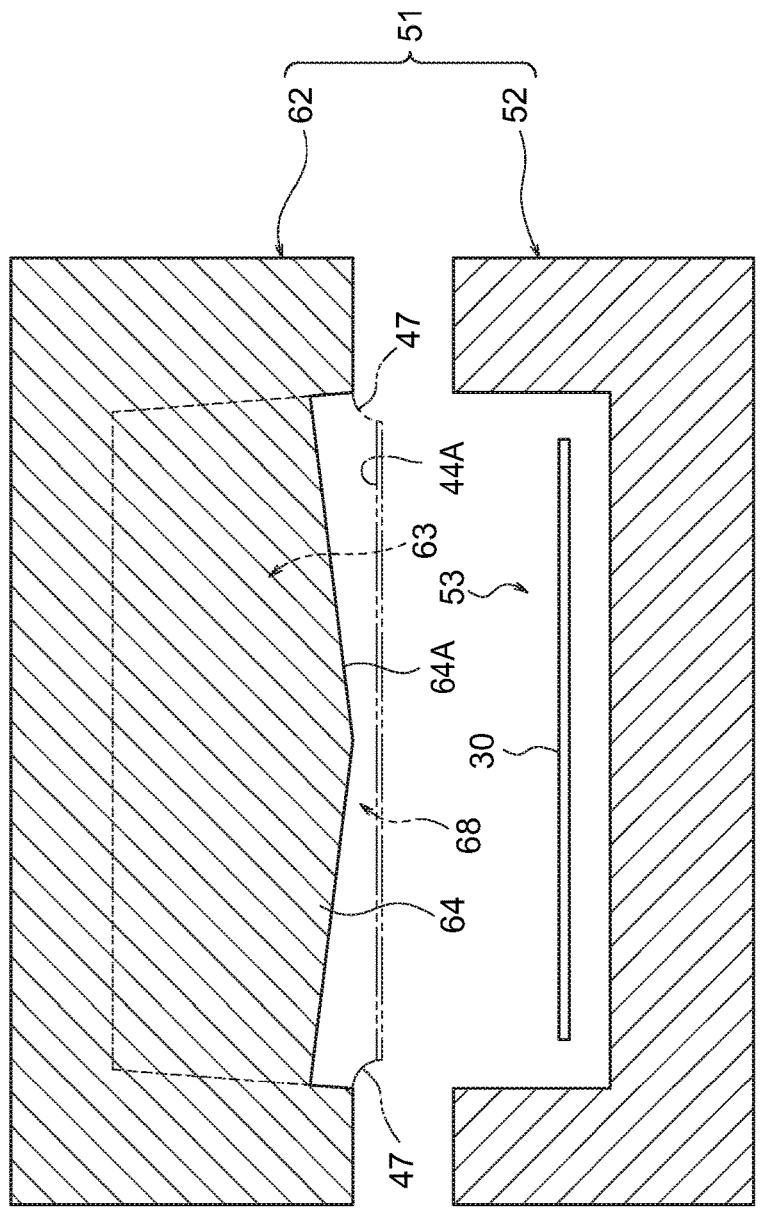
FIG. 17 is a diagram for explaining a modified example of a manufacturing method for an electronic device according to the second exemplary embodiment.

Namely, in the modified example illustrated in FIG. 17, the projections 64 of the second mold 62 are formed such that the end portions at both length L direction sides thereof have a shorter projection length than that of length L direction central portions thereof. When the projections 64 are formed in this manner, the gaps 68 formed between the leading end portions 64A of the projections 64 and the bottom portions 44A can be made larger at both length L direction sides than at the length L direction central portion. This enables a smooth flow of resin passing through the cut-outs 47 and filling the gaps 68 between the leading end portions 64A of the projections 64 of the second mold 62 and the bottom portions 44A.

Third Exemplary Embodiment

Next, explanation follows regarding a third exemplary embodiment of technology disclosed herein.

In the third exemplary embodiment, the manufacturing method differs from the manufacturing method for an electronic device according to the second exemplary embodiment, described above, as follows.

Figure 19:
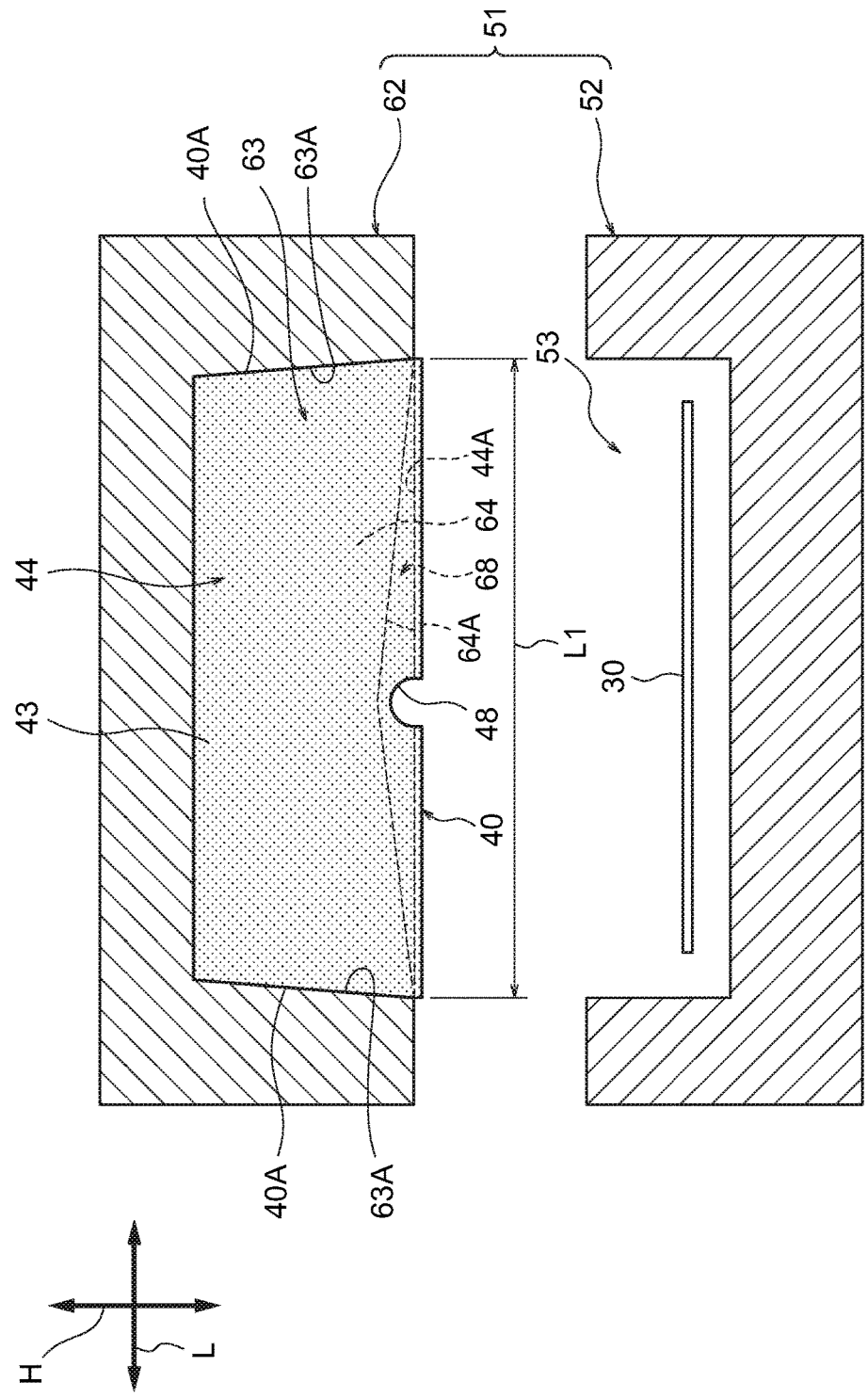
FIG. 19 is a diagram for explaining a manufacturing method of an electronic device according to the third exemplary embodiment.

As illustrated in FIG. 18, in the manufacturing method for an electronic device according to the third exemplary embodiment, the second mold 62 is structured as follows. The projections 64 of the second mold 62 are formed such that the length L direction central portions thereof have a shorter projection length that that of the end portions at both length L direction sides thereof. Namely, as illustrated in FIG. 19, the leading end portions 64A of the projections 64 are formed so as to approach the bottom portions 44A on progression from the length L direction central portions thereof toward the end portions. In the third exemplary embodiment, the electronic device is manufactured under the following principles using a second mold 62 with such a structure.

First, as illustrated in FIG. 19, the substrate 30 is housed in the first cavity 53 inner side the first mold 52, and the heat dissipating sheet 40 is housed in the second cavities 63 inner side the second mold 62.

The heat dissipating sheet 40 is pre-formed so as to have a length in the length L direction that is equal to the length L1 of the first cavity 53 and the second cavities 63 in the length L direction. Namely, in the third exemplary embodiment, the length L direction end portions 40A of the heat dissipating sheet 40 are inclined with respect to the height H direction so as to approach the length L direction end sides on progression toward the height H direction lower side. Then, in a state in which the heat dissipating sheet 40 is attached to the second mold 62, the length L direction end portions 40A of the heat dissipating sheet 40 extend in a straight line along the side faces 63A of the second cavities 63 in the length L direction. Moreover, the bottom portions 44A are formed in flat shapes, and are positioned at the same height as the lower face of the second mold 62.

Holes 48, which are examples of an "inflow port", are pre-formed in length direction central portions of the bottom portions 44A of the heat dissipating sheet 40. The holes 48 are formed when the heat dissipating sheet 40 is pressed. The holes 48 penetrate the thickness direction of the bottom portions 44A and place the inner side of the fins 43 in communication with the grooves 44. The holes 48 are formed in a circular shape as an example. Moreover, the gaps 68 are formed between the leading end portions 64A of the projections 64 of the second mold 62 inserted into the grooves 44 and the bottom portions 44A. Then, in a state in which the heat dissipating sheet 40 and the substrate 30 are thus set up in the mold 51, the first mold 52 and the second mold 62 are assembled together.

Figure 20:
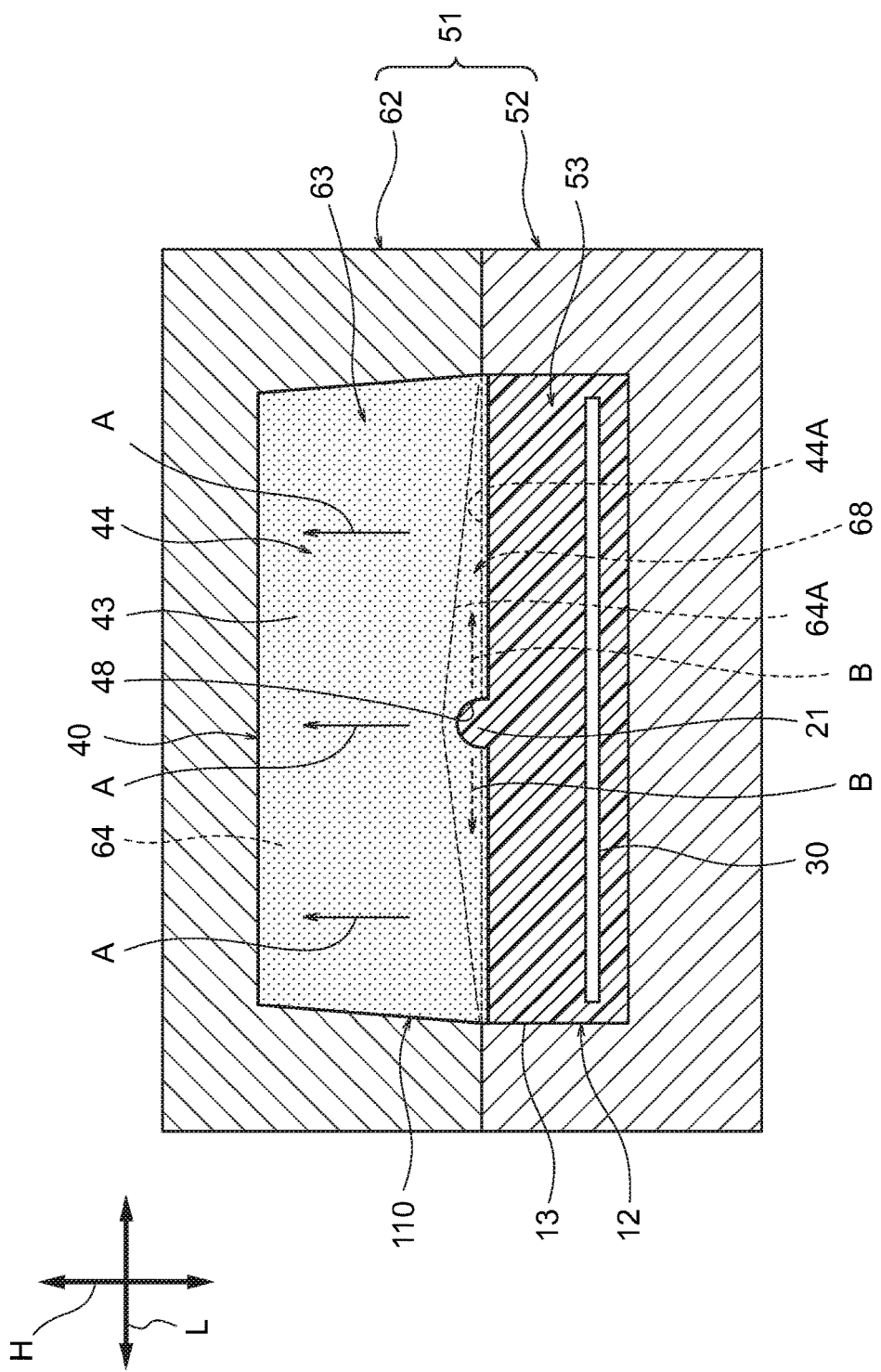
FIG. 20 is a diagram for explaining a manufacturing method for an electronic device according to the third exemplary embodiment.

Next, as illustrated in FIG. 20, resin, which is an example of a "first material", is injected into the mold 51 in a molten state. The resin injected into the mold 51 flows from the inner side of the fins 43 toward the apexes 43A of the fins 43 as indicated by the arrows A in FIG. 20, and is filled into the inner side of the fins 43. The fins 43 bulge and adhere to the inner faces of the second cavities 63 due to resin being filled into the inner side of the fins 43. The resin inner side the fins 43 passes through the holes 48 and fills the gaps 68 between the leading end portions 64A of the projections 64 and the bottom portions 44A, as indicated by the arrows B in FIG. 20.

Then, the resin filled into the mold 51 as described above is cooled and solidified to form the base 13, the plural protrusions 14, and the plural covering portions 16 (see FIG. 1, FIG. 2), similarly to in the first and second exemplary embodiments.

Figure 21:
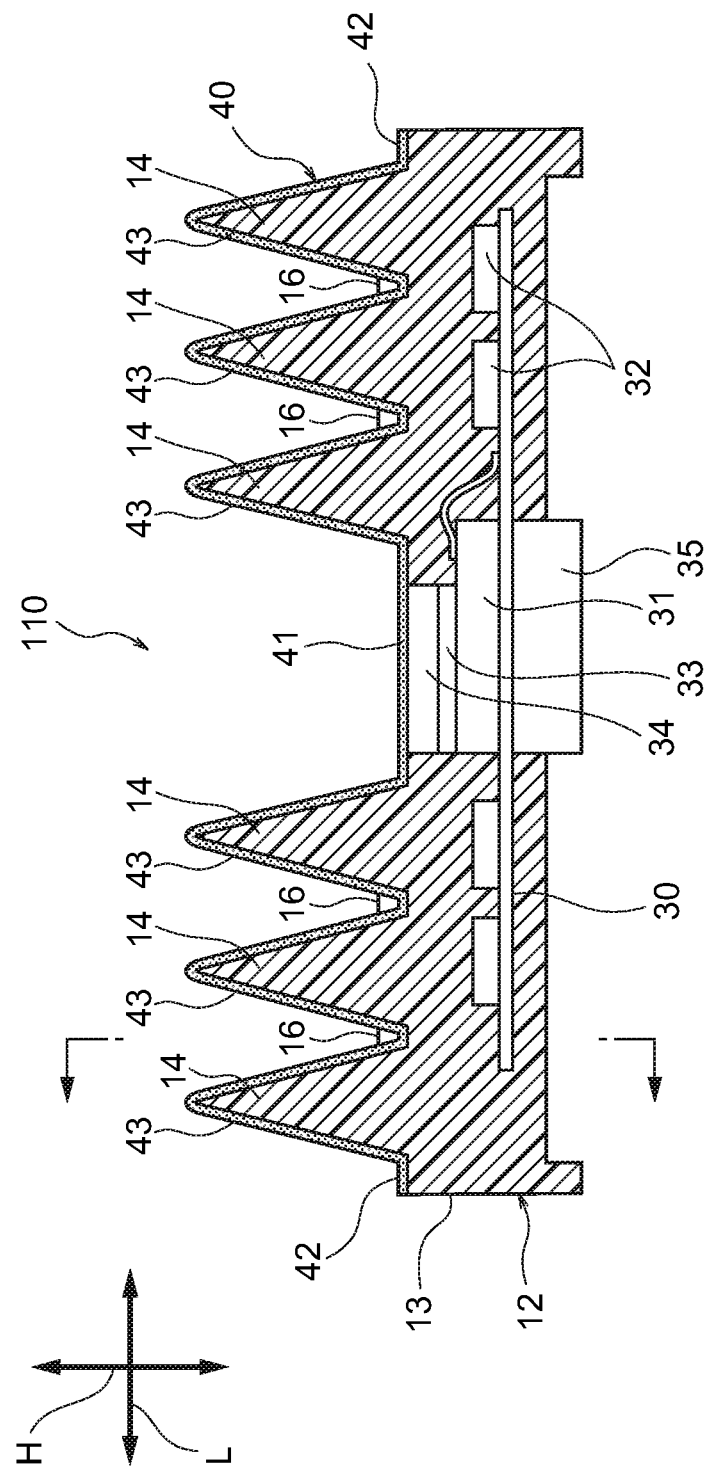
FIG. 21 is a cross-section as viewed from the front of an electronic device according to the third exemplary embodiment.
Figure 22:
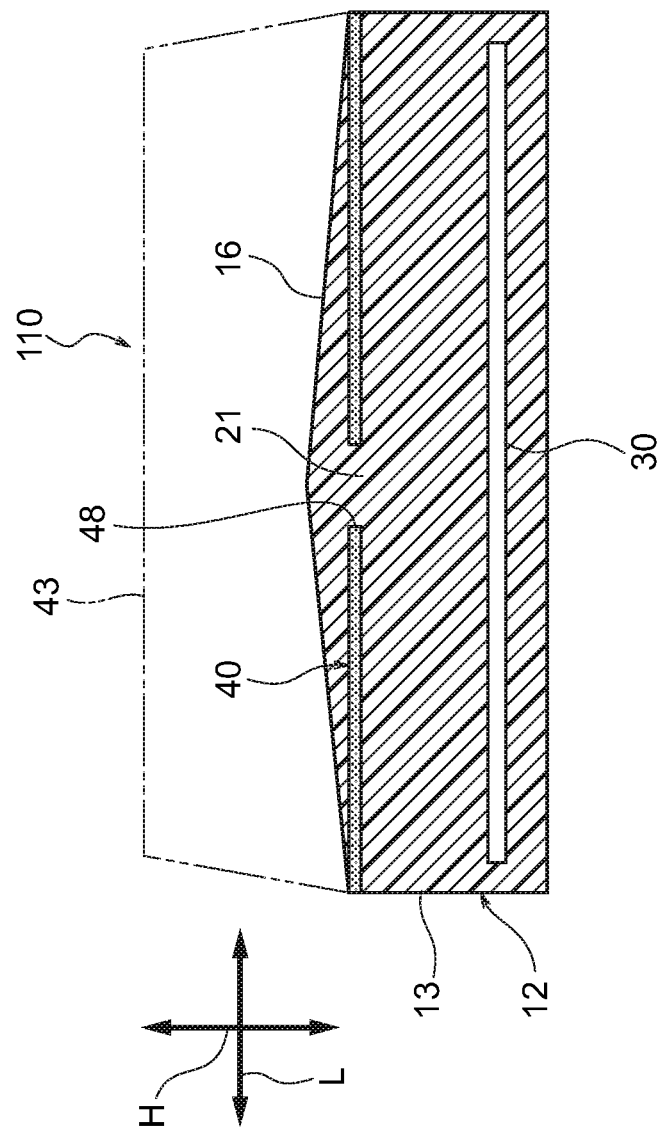
FIG. 22 is a side face cross-section of an electronic device according to the third exemplary embodiment.

In the third exemplary embodiment, an electronic device 110 (also see FIG. 21, FIG. 22) is manufactured by the principles described above. In the electronic device 110 manufactured in this manner, the main body 12 and the covering portions 16 are integrally formed through coupling portions 21 formed in the holes 48 (also see FIG. 22). Moreover, the main body 12 and the covering portions 16 are integrated with the heat dissipating sheet 40 by molding as described above. As illustrated in FIG. 22, the covering portions 16 are formed such that the thickness of the length L direction central portions of the covering portions 16 is thicker than the thickness of both length L direction end portions of the covering portions 16.

In the manufacturing method for an electronic device according to the third exemplary embodiment, the main body 12 and the covering portions 16 are integrally formed by molding similarly to in the first and second exemplary embodiment. Accordingly, there are fewer manufacturing processes than in cases in which, for example, the main body 12 and the covering portions 16 are formed separately. This enables the cost of the electronic device 10 to be reduced.

Moreover, the covering portions 16 are formed such that the thickness of the length L direction central portions of the covering portions 16 is thicker than the thickness of both length L direction side end portions of the covering portions 16. Accordingly, in cases in which, for example, the electronic device 110 is employed outdoors with the fins 43 facing upward, foreign matter collected on the covering portions 16 can be washed off by rainfall due to the incline (taper) of the covering portions 16.

Although the holes 48 of the heat dissipating sheet 40 are formed circular shapes in the third exemplary embodiment, the holes 48 may be formed in a shape other than a circle.

Fourth Exemplary Embodiment

Next, explanation follows regarding a fourth exemplary embodiment according to technology disclosed herein.

In the fourth exemplary embodiment, the manufacturing method differs from the manufacturing method for an electronic device according to the first to the third exemplary embodiments, described above, as follows.

Figure 23:
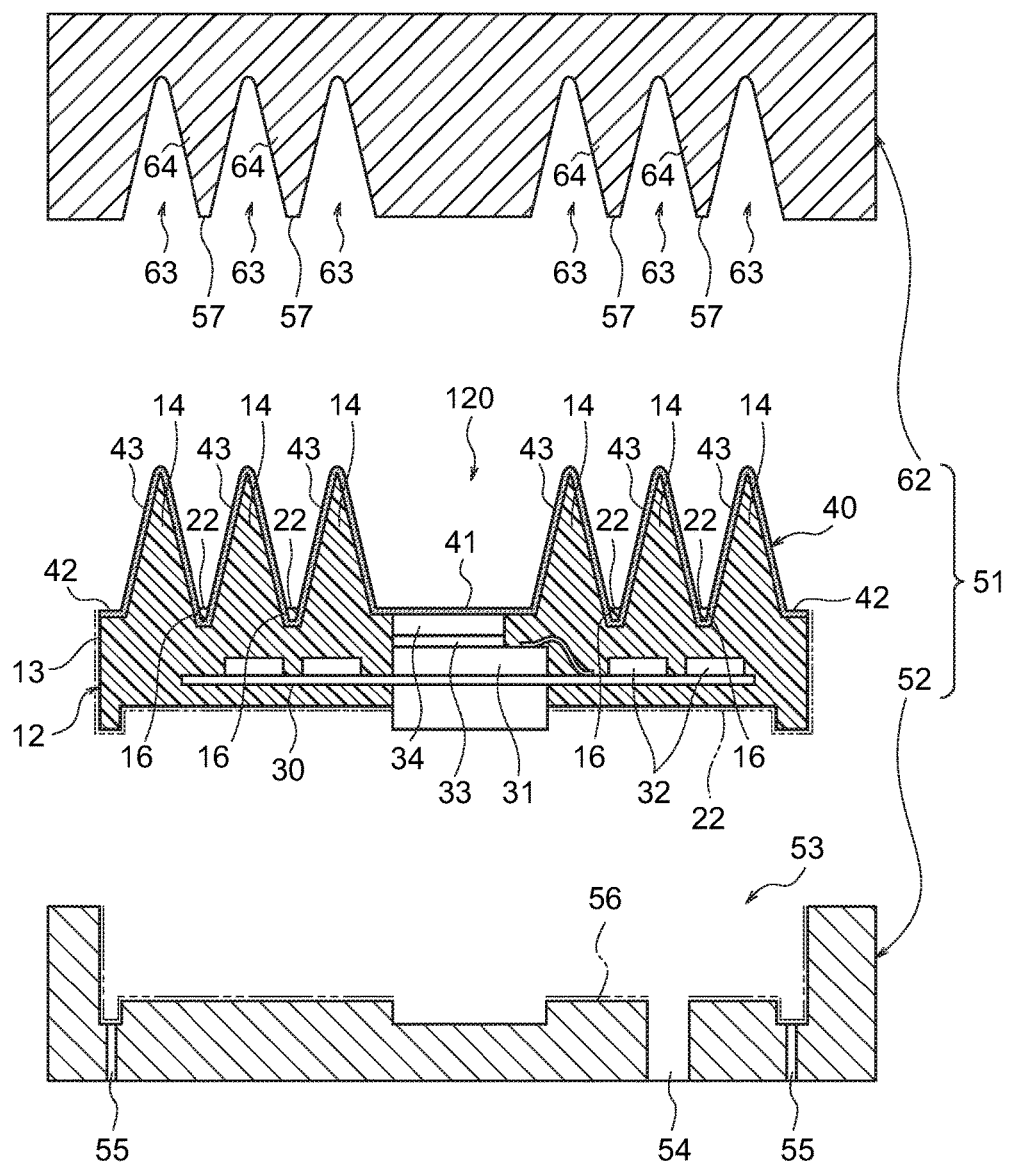
FIG. 23 is a diagram for explaining a manufacturing method of an electronic device according to a fourth exemplary embodiment.

As illustrated in FIG. 23, in the manufacturing method for an electronic device according to the fourth exemplary embodiment, the mold 51 is structured as follows. Out of the inner faces (molding faces) of the first cavity 53 formed in the first mold 52, the side faces of the first cavity 53 that oppose the side faces of the main body 12 and the bottom faces of the first cavity 53 that oppose the bottom faces of the main body 12, are each formed with a transfer portion 56. Similarly, out of the inner faces (molding faces) of the second cavities 63 formed in the second mold 62, leading end faces of the projections 64 that oppose the surface of the covering portions 16 are formed with a transfer portion 57.

The respective transfer portions 56, 57 are structured to include indentations and protrusions so as to be able to form graining 22 on the surfaces of the main body 12 and the covering portions 16 of an electronic device 120 as described below. In the fourth exemplary embodiment, the electronic device 120 is manufactured under similar principles to those of the first exemplary embodiment described above, using the mold 51 that includes such transfer portions 56, 57.

Figure 24:
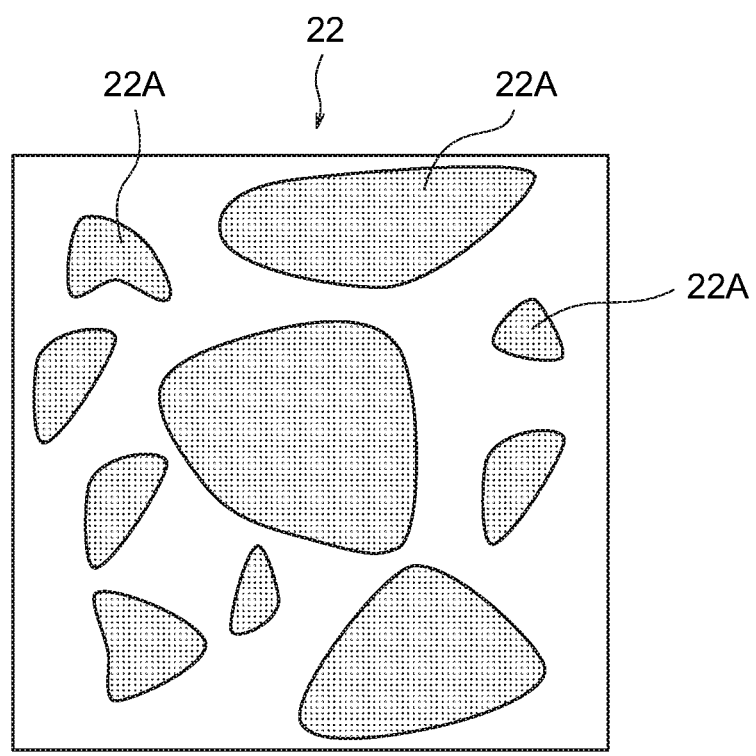
FIG. 24 is an enlarged view of graining formed on an electronic device according to the fourth exemplary embodiment.

In the electronic device 120 thus manufactured, graining 22 is respectively formed on the side faces of the main body 12, the bottom faces of the main body 12, and the surface of the covering portions 16 as an example of "anti-fouling treatment", using the transfer portions 56, 57. As illustrated in FIG. 24, the graining 22 includes plural protrusions 22A (land portions). A shape that exhibits the advantageous effects of not being easily damaged, not easily becoming dirty, and being easily cleaned is suitably applied for the graining 22.

In this manner, in the fourth exemplary embodiment, the side faces of the main body 12, the bottom faces of the main body 12, and the surface of the covering portions 16 are formed with the graining 22. Due to the graining 22, this thereby enables the side faces of the main body 12, the bottom faces of the main body 12, and the surface of the covering portions 16 to be suppressed from becoming dirty.

Figure 25:
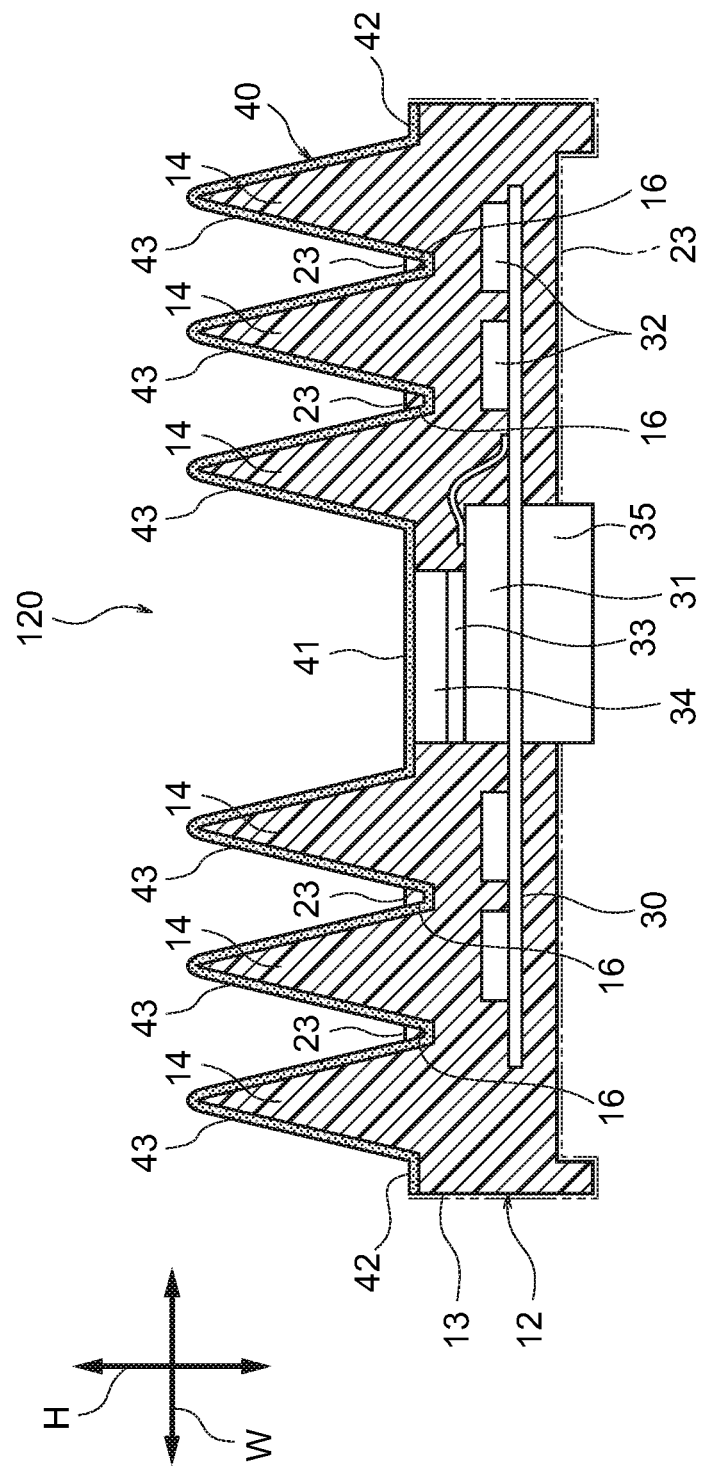
FIG. 25 is a cross-section as viewed from the front illustrating a first modified example of an electronic device according to a fourth exemplary embodiment.

In the fourth exemplary embodiment, as illustrated in FIG. 25, as an example of "anti-fouling treatment", a fine periodic structure 23 may be formed on the side faces of the main body 12, the bottom faces of the main body 12, and the surface plural covering portions 16, instead of the graining 22 described above (see FIG. 23, FIG. 24).

Figure 26:
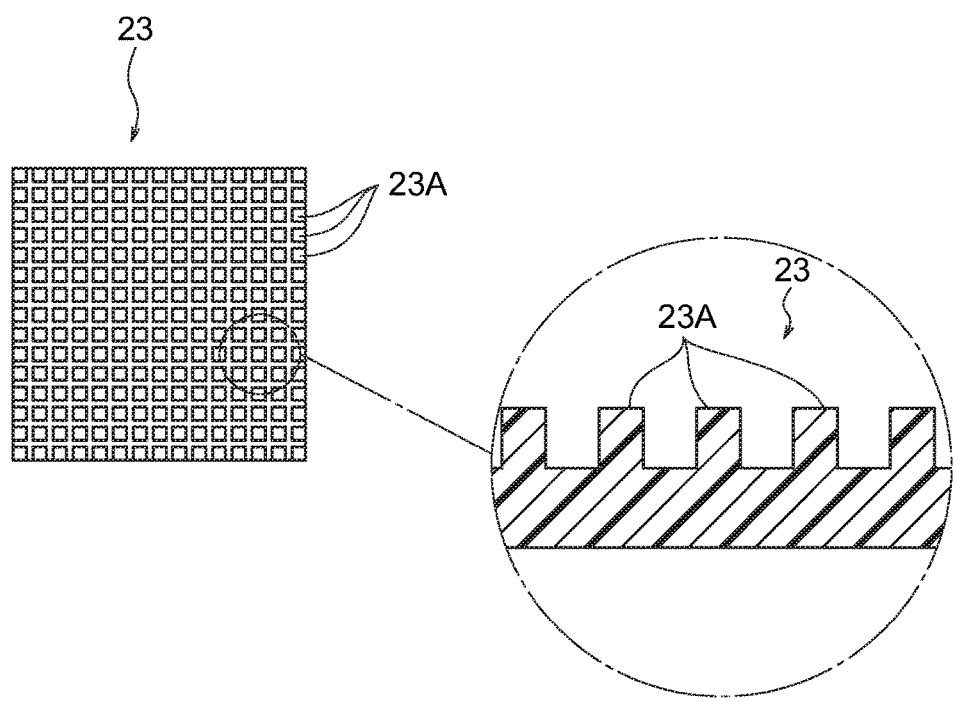
FIG. 26 is an enlarged view of a fine periodic structure in a first modified example of an electronic device according to the fourth exemplary embodiment.

The fine periodic structure 23 is formed by changing the structure of the transfer portions 56, 57 of the mold 51 (see FIG. 23). As illustrated in FIG. 26, as an example, the fine periodic structure 23 includes plural fine projections 23A that form a lattice. The array pitch of the plural fine projections is preferably from 5 μm to 20 μm. For example, a shape that exhibits water repellency due to the lotus effect, or a shape that exhibits self-cleaning activity, is suitably applied as the fine periodic structure 23. A fine periodic structure 23 having such plural fine projections also enables the side faces of the main body 12, the bottom faces of the main body 12, and the surface of the covering portions 16 to be suppressed from becoming dirty.

Moreover, although the graining 22 or the fine periodic structure 23 is formed by the transfer portions 56, 57 in the fourth exemplary embodiment, the graining 22 or the fine periodic structure 23 may be formed by an additional process after removing the electronic device 120 from the mold 51.

Figure 27:
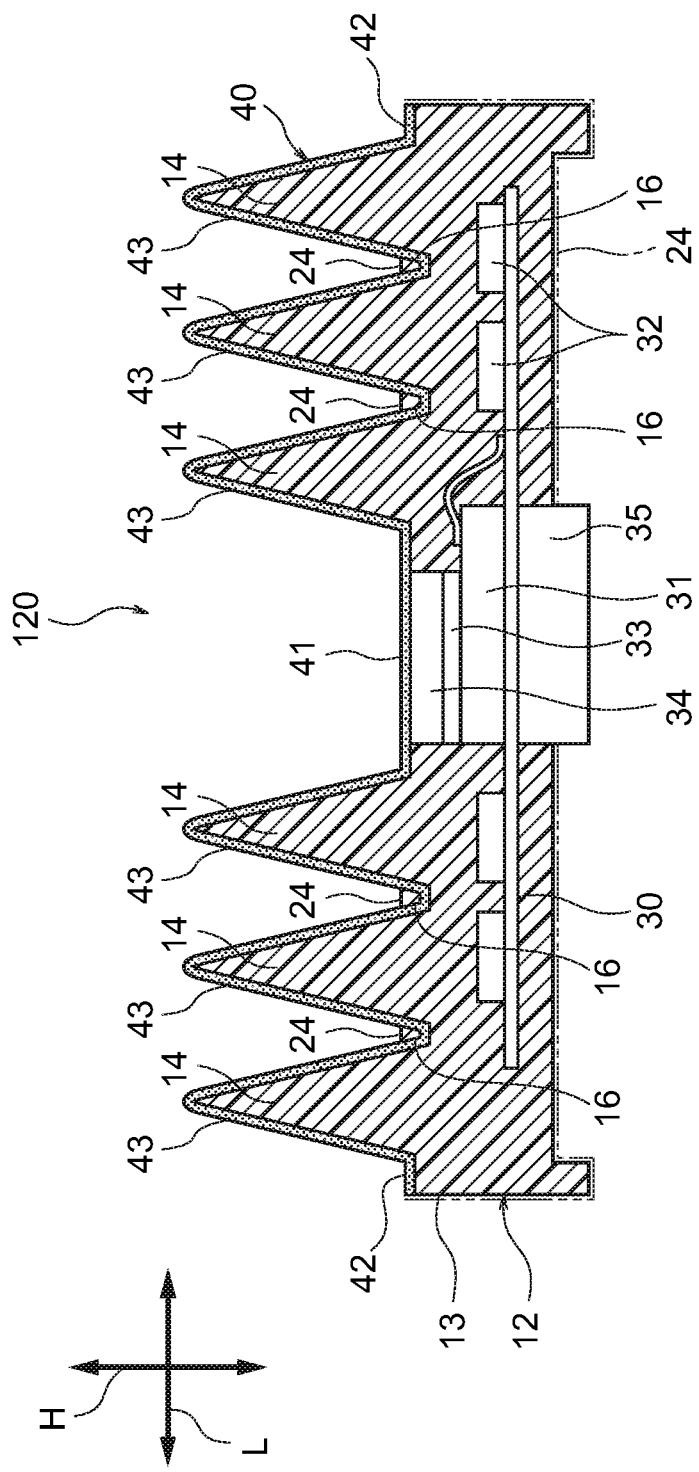
FIG. 27 is a cross-section as viewed from the front illustrating a second modified example of an electronic device according to the fourth exemplary embodiment.

As illustrated in FIG. 27, after the electronic device 120 has been removed from the mold 51, as an example of "anti-fouling treatment", a coating layer 24 having hydrophilicity and hydrophobicity may be formed on the side faces of the main body 12, the bottom faces of the main body 12, and the surface of the covering portions 16.

For the coating layer 24, it is possible to employ a coating material having hydrophilicity and hydrophobicity. Examples of such coating materials include a combination of an acrylic polymer having hydrophilicity and a fluorine polymer having hydrophobicity, or fine particles of a hydrophobic fluorine resin dispersed in a hydrophilic coating material at intervals smaller than dirt particles. Such a coating layer 24 also enables the side faces of the main body 12, the bottom faces of the main body 12, and the surface of the covering portions 16 to be suppressed from becoming dirty.

In the fourth exemplary embodiment, the graining 22, the fine periodic structure 23, and the coating layer 24 may be formed on the side faces of the main body 12 and the bottom faces of the main body 12 without being formed on the surface of the covering portions 16. The graining 22, the fine periodic structure 23, and the coating layer 24 may be formed on the surface of the covering portions 16 without being formed on the side faces of the main body 12 or the bottom faces of the main body 12. The graining 22, the fine periodic structure 23, and the coating layer 24 may be formed anywhere, as long as they are formed on at least a portion of a surface of the main body 12 or the covering portions 16, or both.

Fifth Exemplary Embodiment

Next, explanation follows regarding a fifth exemplary embodiment according to technology disclosed herein.

Figure 28:
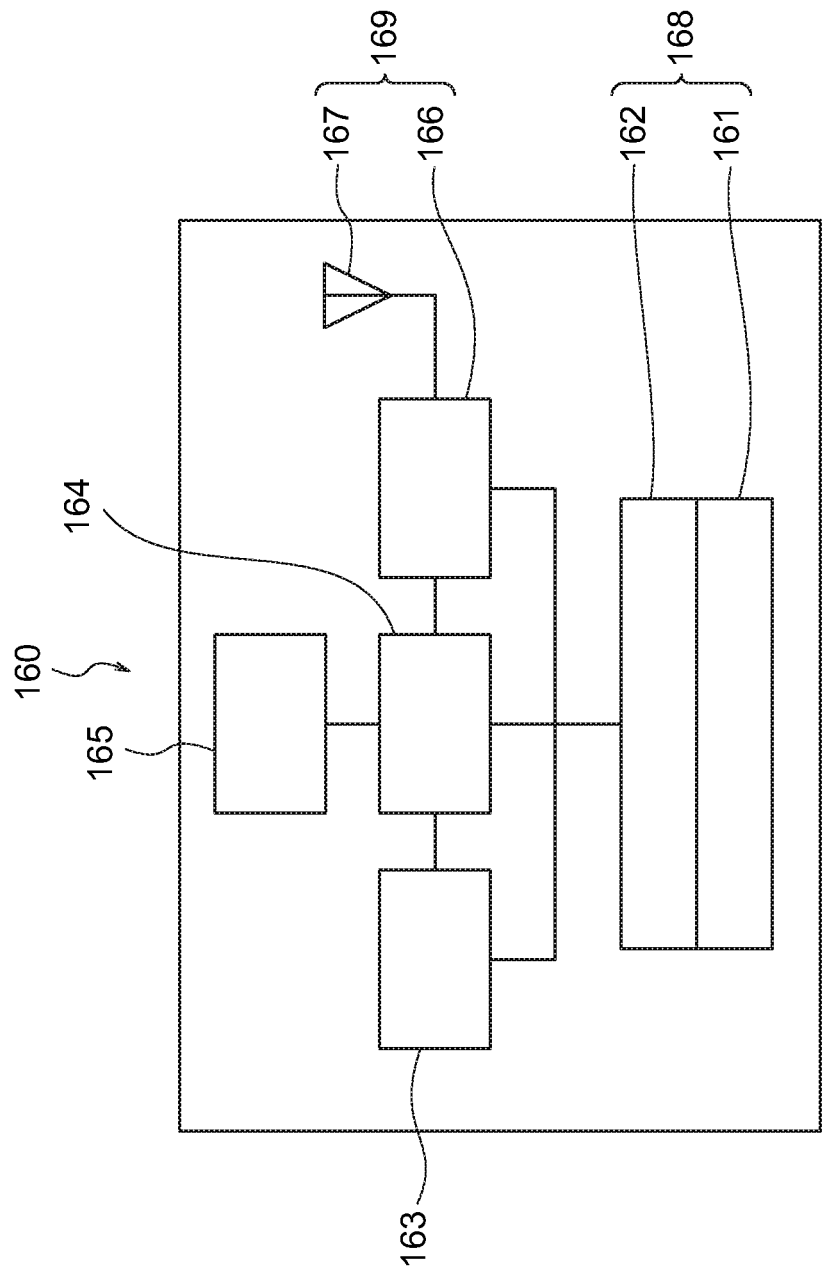
FIG. 28 is a diagram illustrating an integrated module according to a fifth exemplary embodiment.

As illustrated in FIG. 28, an integrated module 160 according to the fifth exemplary embodiment includes a power generating module 161, a power storing module 162, a sensor 163, a controller 164, a memory 165, a communication circuit 166, and an antenna 167.

For example, the electronic device of the first to the fourth exemplary embodiment described above is employed in the power generating module 161. Namely, the power generating module 161 includes the substrate 30 packaged with the thermoelectric element 31 and the like (not including the communication component 32), the main body 12, the heat dissipating sheet 40, and the plural covering portions 16 (see FIG. 1 to FIG. 27, mentioned above).

The power storing module 162 is connected to the power generating module 161, and stores power generated by the power generating module 161. Any component with functionality for storing power may be employed as the power storing module 162. The power storing module 162 is preferably, for example, a solid-state secondary battery, from the viewpoints of having high safety while saving space.

The power generating module 161 and the power storing module 162 form a power supply section 168. Power is supplied to the sensor 163, the controller 164, and the communication circuit 166 from at least one out the power generating module 161 and the power storing module 162 that form the power supply section 168. The power storing module 162 may be omitted in cases in which power can be supplied stably from the power generating module 161.

The sensor 163 is an example of a "detector". For example, a sensor that detects temperature, humidity, pressure, light, sound, magnetic waves, acceleration, vibration, gas, fine particles, or the like may be employed as the sensor 163. Moreover, a distance sensor that measures a distance to a target object by emitting infrared light toward the target object and receiving light reflected back from the target object, a weight sensor that measures the weight of a target object, a water level sensor that detects data such a water level, or the like may be employed as the sensor 163.

The controller 164, for example, transmits various data detected by the sensor 163 to a server via the communication circuit 166 and the antenna 167. The controller 164 may, for example, transmit secondary data based on the various data detected by the sensor 163 and other data to the server. Moreover, the controller 164, for example, may compute secondary data by performing a specific calculation using the various data detected by the sensor 163, and transmit the secondary data to the server.

The memory 165 stores the various data detected by the sensor 163 and computed secondary data on instruction by the controller 164. Stored information is read on instruction from the controller 164.

The communication circuit 166 and the antenna 167 form a communication section 169. The communication section 169 transmits and receives data between the controller 164 and the server, which is not illustrated in the drawings. Although wireless communication using the antenna 167 is employed as illustrated in the example of FIG. 28, wired communication may be employed instead of wireless communication.

Figure 29:
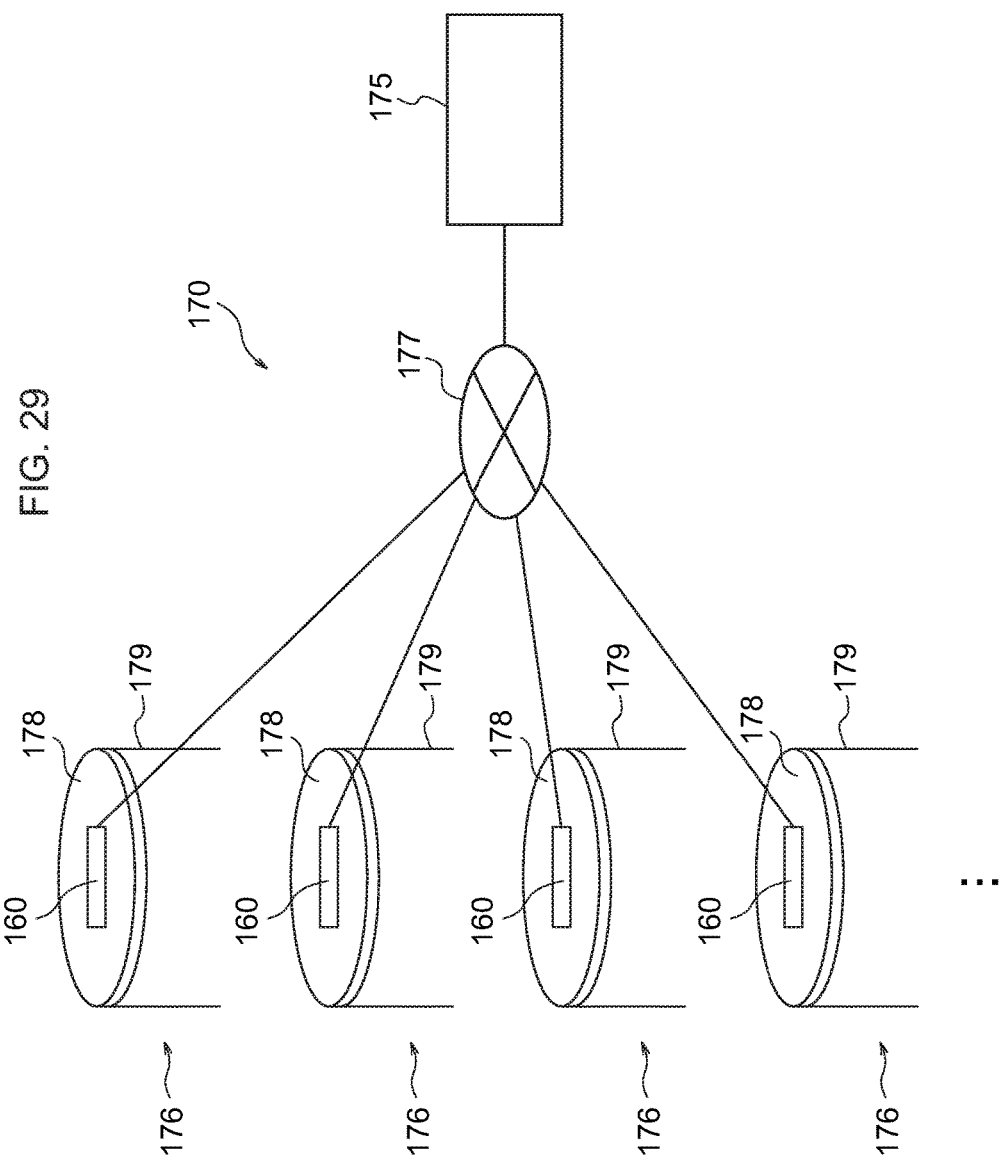
FIG. 29 is a diagram illustrating an information processing system according to the fifth exemplary embodiment.

As illustrated in FIG. 29, the integrated module 160 described above employs, for example, an information processing system 170 according to the fifth exemplary embodiment. The information processing system 170 includes plural integrated modules 160 and a server 175.

The plural integrated modules 160 are installed in manholes 176. The plural integrated modules 160 installed in plural manholes 176 are connected to the server 175 via a network 177.

Note that, for example, data may be transmitted from the integrated modules 160 to the server 175 by near field communication each time a travelling vehicle provided with the server 175 approaches the integrated modules 160 installed in each of the manholes 176. An integrated module 160 may be installed anywhere on a structural member of a manhole 176.

Each integrated module 160 is, for example, fixed to a lid 178 or a concrete pipe 179, which are structural members of the manholes 176, depending on the detection target of the sensor 163 and the type of the sensor 163. The thermoelectric element 31 provided to each integrated module 160 is thermally connected to the structural member of a manhole 176, which is an example of an "installation target", and power is generated due to a temperature difference between the structural member of the manhole 176 and either external air or the temperature inner side the manhole 176.

Next, explanation follows regarding a specific application example of the information processing system 70 according to the fifth exemplary embodiment.

First Example Application of Fifth Exemplary Embodiment

Figure 30:
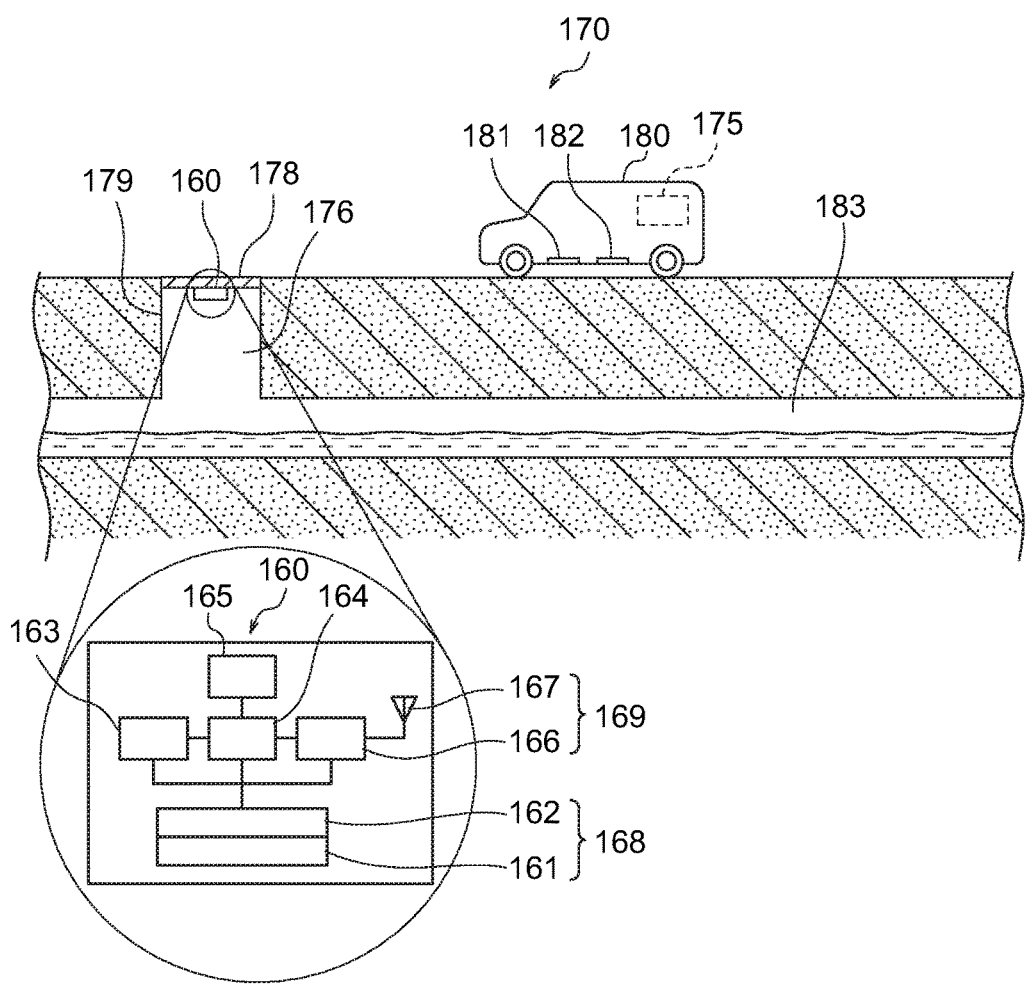
FIG. 30 is a diagram illustrating a usage state of an information processing system according to a first example application of the fifth exemplary embodiment.

In a first example application illustrated in FIG. 30, the information processing system 170 is employed in order to ascertain degradation of the structural members of manholes 176 (the lids 178 or the concrete pipes 179). A sensor 163 detects the temperature or humidity inner side a manhole 176, vibrations (acceleration) acting on the structural member of the manhole 176, or the like, and data detected by the sensor 163 is accumulated in the memory 165.

When a measuring vehicle 180 travelling on a road passes over the manhole 176, the controller 164 transmits the data accumulated by the memory 165 via the communication circuit 166 and the antenna 167. The server 175 provided to the measuring vehicle 180 collects the data.

The server 175 combines position information of the vehicle 180 from a global positioning system (GPS) with the collected data, and displays the collected data on a map displayed on an in-car monitor. The degree of degradation of the concrete pipe 179 in each of the manholes 176 is estimated from the information expressing the temperature, humidity, vibrations, or the like.

In addition to a receiving device 181, a camera 182 that acquires images of the lid 178 of the manhole 176 is attached to a lower portion of the measuring vehicle 180, and degradation of the lid 178 (an iron part) of the manhole 176 is determined using image recognition. Based on the result, the time to replace the lid 178 of the manhole 176 may be sold as information to a local government. Rather than a specialized measuring vehicle, the vehicle collecting the data may, for example, be a garbage truck operated by the local government. Installing the receiving device 181 and the camera 182 to the bottom portion of a garbage truck enables data to be collected periodically without incurring collection expenses.

The sensor 163 may detect the concentration of a gas generated inner side the manhole 176. The gas generated inner side the manhole 176 may, for example, be hydrogen sulfide gas. Hydrogen sulfide gas generated by a sewer 183 is known to rapidly degrade structural members of manholes 176. The generation of hydrogen sulfide gas is also a cause of complaint among local residents. Using a hydrogen sulfide gas sensor as the sensor 163 increases the precision of degradation predictions for the structural members of manholes 176, and enables complaints by residents to be swiftly dealt with.

In the first example application, it is sufficient for the sensor 163 to detect at least one out of the temperature, humidity, or vibrations inner side a manhole 176, or a concentration of gas generated inner side the manhole 176.

There is also the possibility that the humidity inner side the manhole 176 is always high, or that water in the sewer 183 (or water supply) overflows inner side the manhole 176. Although temperature is approximately constant inner side the manhole 176, it is, for example, known that the lid 178 is at higher temperature in summer and at lower temperature in winter, and that hydrogen sulfide gas causes various metals dissolve. It is important to protect electronic components such as the sensor 163 and the thermoelectric element 31 (see FIG. 1, etc.) in such harsh environments, and to maintain long-term reliability. According to the integrated module 160, long-term reliability can be maintained since the electronic components such as the sensor 163 and the thermoelectric element 31 are encapsulated by resin.

Second Example Application of Fifth Exemplary Embodiment

Next, explanation follows regarding a second example application of the fifth exemplary embodiment.

Figure 31:
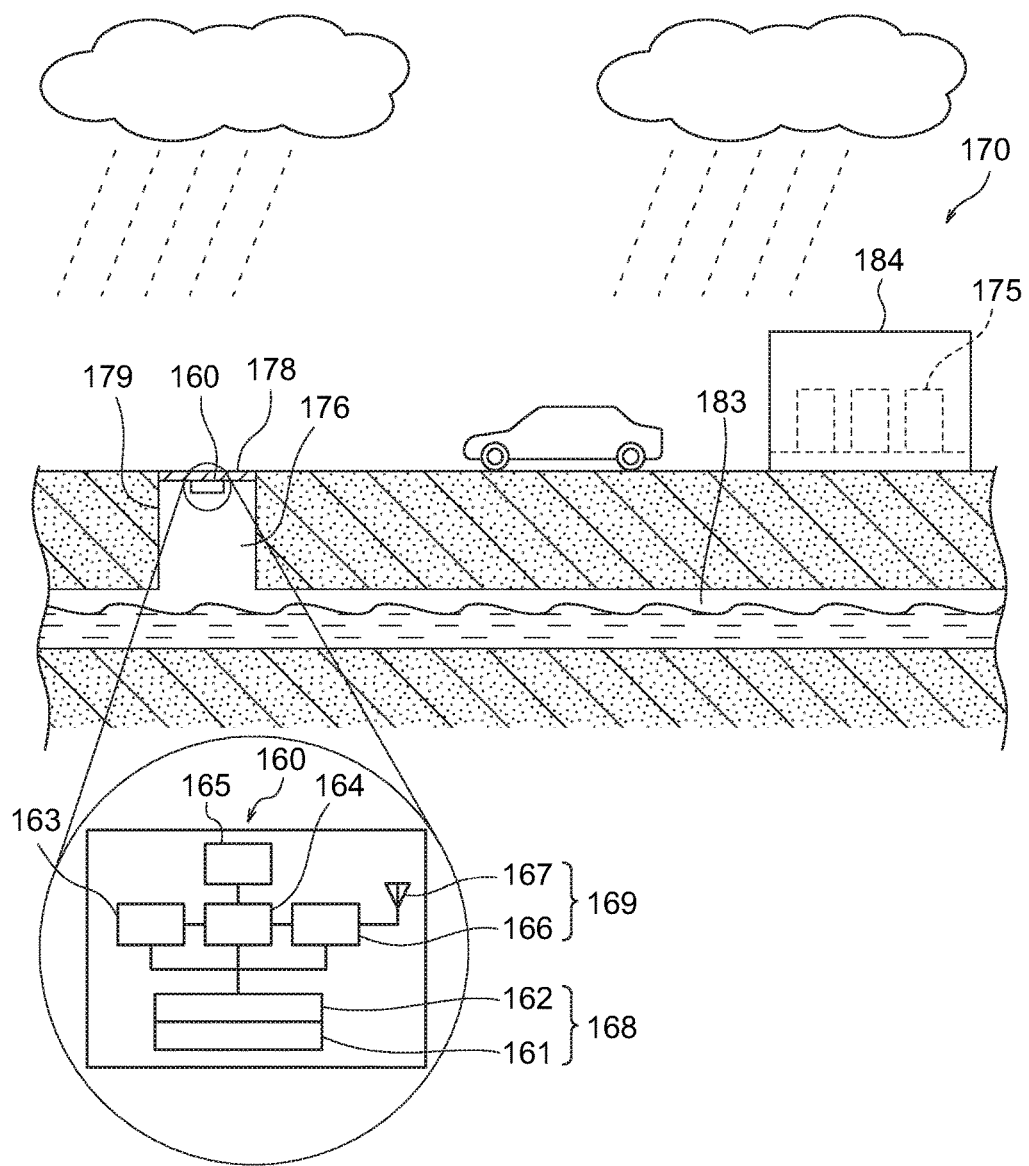
FIG. 31 is a diagram illustrating a usage state of an information processing system according to a second example application of the fifth exemplary embodiment.

In the second example application illustrated in FIG. 31, the information processing system 170 is applied in order to predict a flow rate in the sewer 183 connected to the manholes 176. The sensor 163 employs, for example, a water level meter or a flow meter. Installing the sensor 163, which is a water level meter or a flow meter, in the manholes 176 enables the flow rate in the sewer 183 to be ascertained in fine detail. Although the sensor 163 is incorporated into the integrated module 160 in FIG. 31, for example, a sensor controller that controls the operation of an external sensor may be provided instead of the sensor 163. The sensor controller may control a sensor such as a water level meter or a flow meter, not illustrated in the drawings, disposed in the sewer 183, and may acquire information detected by the sensor. Moreover, information detected by the sensor may be transmitted to the sensor controller wirelessly.

More specifically, the flow rate in the sewer 183 is detected by the sensor 163 once every day, or once every hour, and data detected by the sensor 163 travels along a high speed communication line and is gathered in the server 175 of a data center 184. The flow rate data of the sewer 183 detected by the sensor 163 may be transmitted at the same time that measurement is made, or may be accumulated and then transmitted every day or week in order to reduce power consumption. Alternatively, data may be collected by a measuring vehicle similarly to in the first application example.

Normally, rain water flows into the sewer 183, such that predictions of flow rate in the sewer 183 are strongly related to rainfall data. Accordingly, analyzing a combination of flow rate data in the sewer 183 gathered by sensors 163 and rainfall data from a meteorological agency enables, for example, flood predictions, and warnings and alerts for waterways that the sewer 183 flows into to be provided.

A relationship can be established between weather phenomena and the flow rate in the sewer 183 from the results of analysis of flow rate data in the sewer 183 and rainfall data from a meteorological agency. Then, the flow rate in the sewer 183 at each location may be predicted from the rainfall data of the meteorological agency, and charges made for the provision and distribution of the prediction data. An information processing system 170 capable of continuously updating data is useful since flow rates in the sewer 183 may change from year to year according to residential home construction, residential statuses, and land development status.

In the second example application, the information processing system 170 can also be utilized for flow rate measurements in the sewer 183 in cases of locally concentrated heavy rainfall. During locally concentrated heavy rainfall in a city, minute-by-minute measurement and information transmission of water levels in the sewer 183 are needed to secure worker safety in the sewer 183 and to prevent the sewer 183 from flooding. In such cases, data gathering may be limited to a small number of integrated modules 160 installed in manholes 176 at relatively low elevations.

The power storing module 162 of the integrated module 160 that measures the water level is preferably stored with sufficient power in advance. The controller 164 sequentially transmits data to the server 175 through the communication circuit 166 and a high speed communication line. The server 175 can issue the received data as a warning to the smartphones and tablets of workers and residents near the flooding. Alternatively, data may be collected in a server provided to a measuring vehicle parked over a specific manhole 176, using near field communication.

Third Example Application of Fifth Exemplary Embodiment

Next, explanation follows regarding a third example application of the fifth exemplary embodiment.

Figure 32:
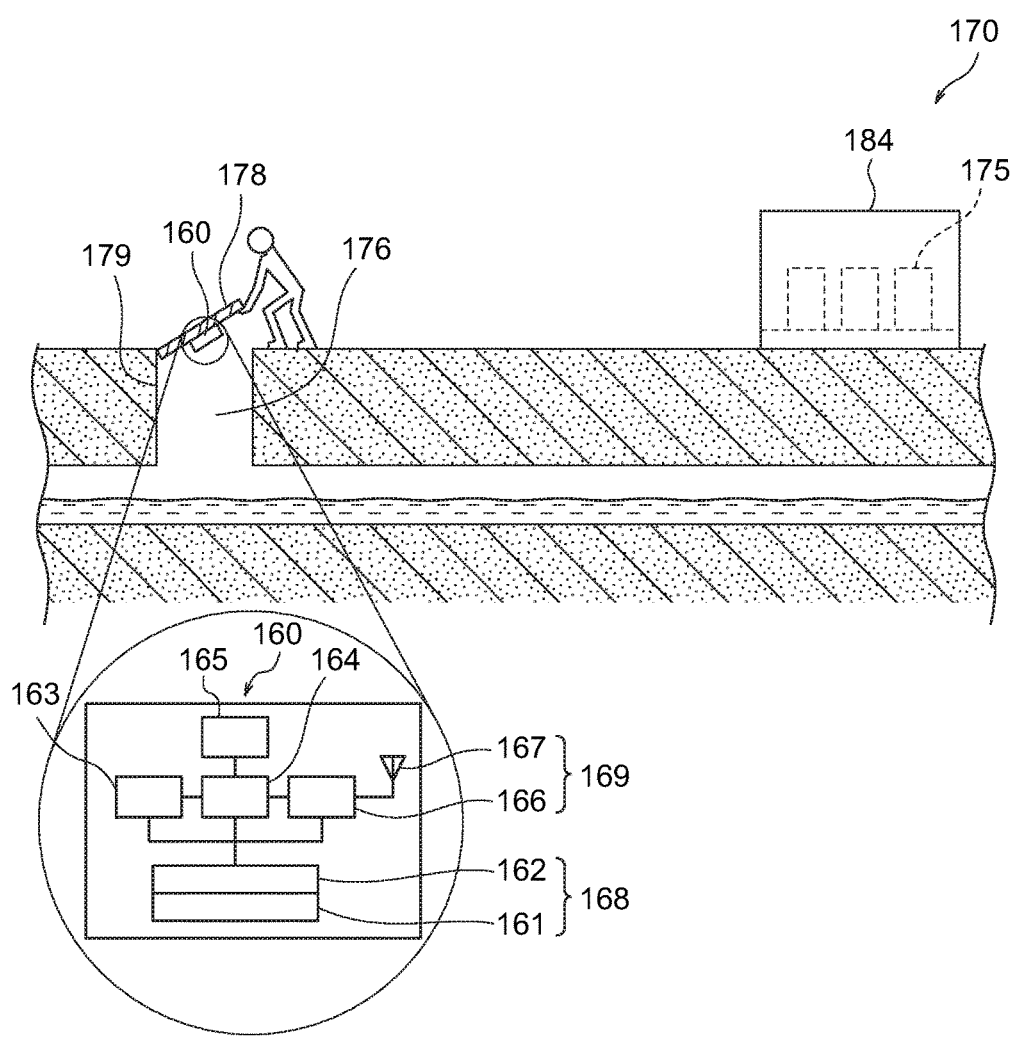
FIG. 32 is a diagram illustrating a usage state of an information processing system according to a third example application of the fifth exemplary embodiment.

In the third example application illustrated in FIG. 32, the information processing system 170 is employed for the security and operation history of the manholes 176. The sensor 163 detects opening and closing of the lids 178 of the manholes 176. The sensor 163, for example, employs an acceleration sensor or an opening and closing switch. It is sufficient for the sensor 163 to detect at least one out of acceleration of the lid 178 of the manhole 176 or open and closed states of the lid 178 of the manhole 176 in order to detect opening and closing of the lid 178 of the manhole 176. Data (signals) output from the sensor 163 in accordance with the opening and closing of the lid 178 of the manhole 176 are received by the server 175.

According to the information processing system 170, security countermeasures (for example, terrorist bombing countermeasures) for the sewer 183 etc., and the operation history of cleaning operations of the sewer 183, can be confirmed.

Fourth Example Application of Fifth Exemplary Embodiment

Next, explanation follows regarding a fourth example application of the fifth exemplary embodiment.

Figure 33:
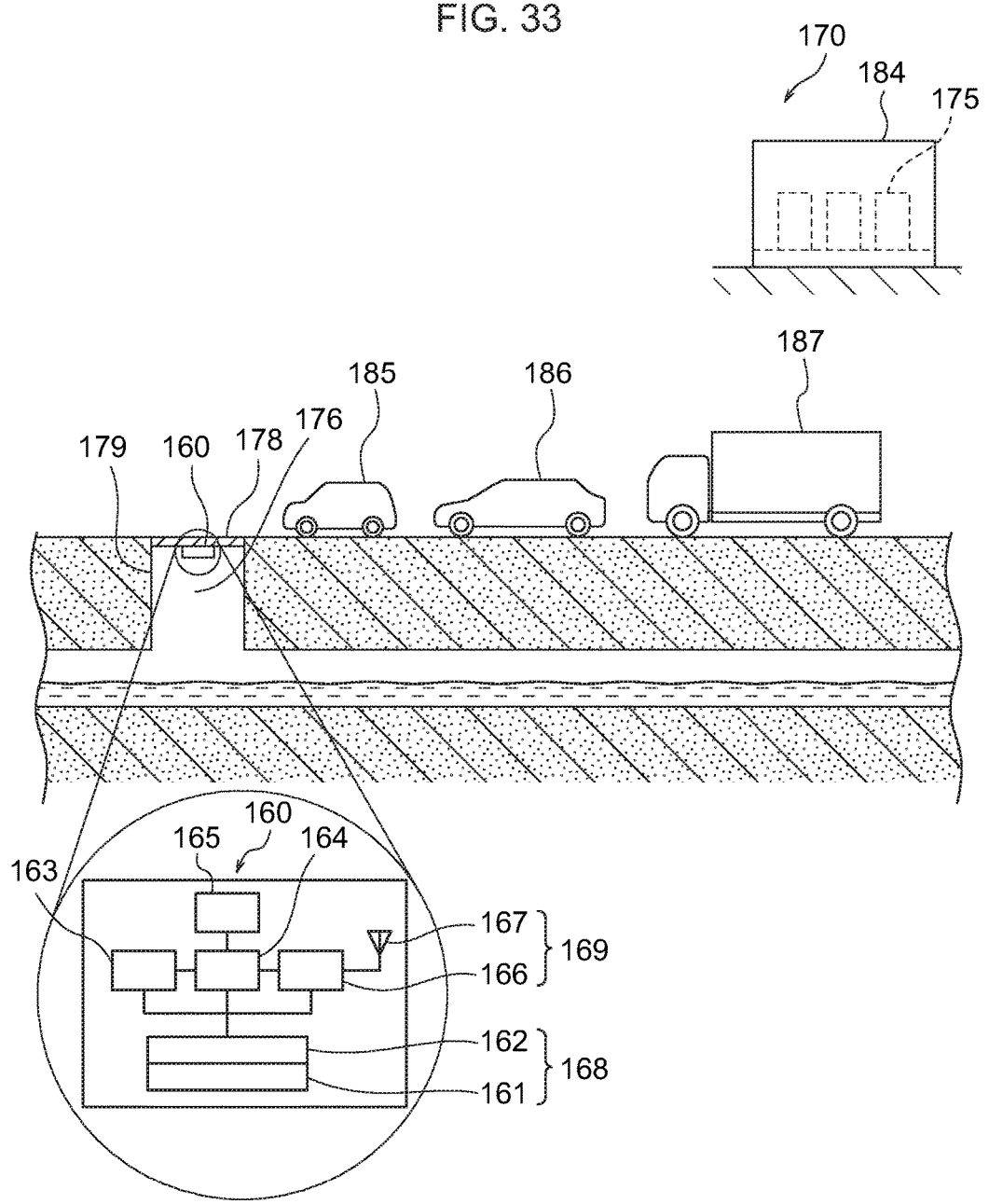
FIG. 33 is a diagram illustrating a usage state of an information processing system according to a fourth example application of the fifth exemplary embodiment.

In the fourth example application illustrated in FIG. 33, the information processing system 170 is employed for acquiring road traffic information. The sensor 163 detects vehicles 185, 186, 187 passing over the manhole 176. For example, an acceleration sensor, a magnetic sensor, a microphone, or the like may be employed by the sensor 163. Signals obtained from the sensor 163 depend on the number vehicles that pass over the manhole 176. Data (signals) output from the sensor 163 are received by the server 175.

According to the information processing system 170, traffic information can be obtained even for small roads, alley ways, and the like for which measurements are not made using current road traffic information communication systems. This enables finely detailed traffic information to be provided.

Moreover, the type of the vehicle 185, 186, 187 (for example, small car, regular car, truck, etc.) passing over the manhole 176 may be detected from the magnitude of the detection value of the sensor 163. In such cases, a data set associating the detection value of the sensor 163 with the type of the vehicle may be pre-stored in the memory 165. Information indicating the type of vehicle determined from the detection value of the sensor 163 and the data set described above is transmitted from the controller 164 to the server 175. This enables the type of vehicle passing over the manhole 176 to be ascertained.

Moreover, individual identification information of the vehicle 185, 186, 187 passing over the manhole 176 may be detected by the sensor 163. For example, in cases in which a magnetic sensor is employed as the sensor 163, it is possible that the characteristics of the vehicle could be obtained from the response of the magnetic sensor. Namely, individual vehicles can be recognized by, for example, installing a medium that gives out characteristic magnetism by vehicle. Analysis of differences in the flow of vehicles in a city by vehicle type is relevant to municipal road control and municipal evaluation, such as for schemes to guide certain vehicles onto certain roads.

In the fourth example application, it is sufficient for the sensor 163 to detect at least one out of the number, type, or individual identification information of vehicles passing over the manhole 176.

Fifth Example Application of Fifth Exemplary Embodiment

Next, explanation follows regarding a fifth application example of the fifth exemplary embodiment.

Figure 34:
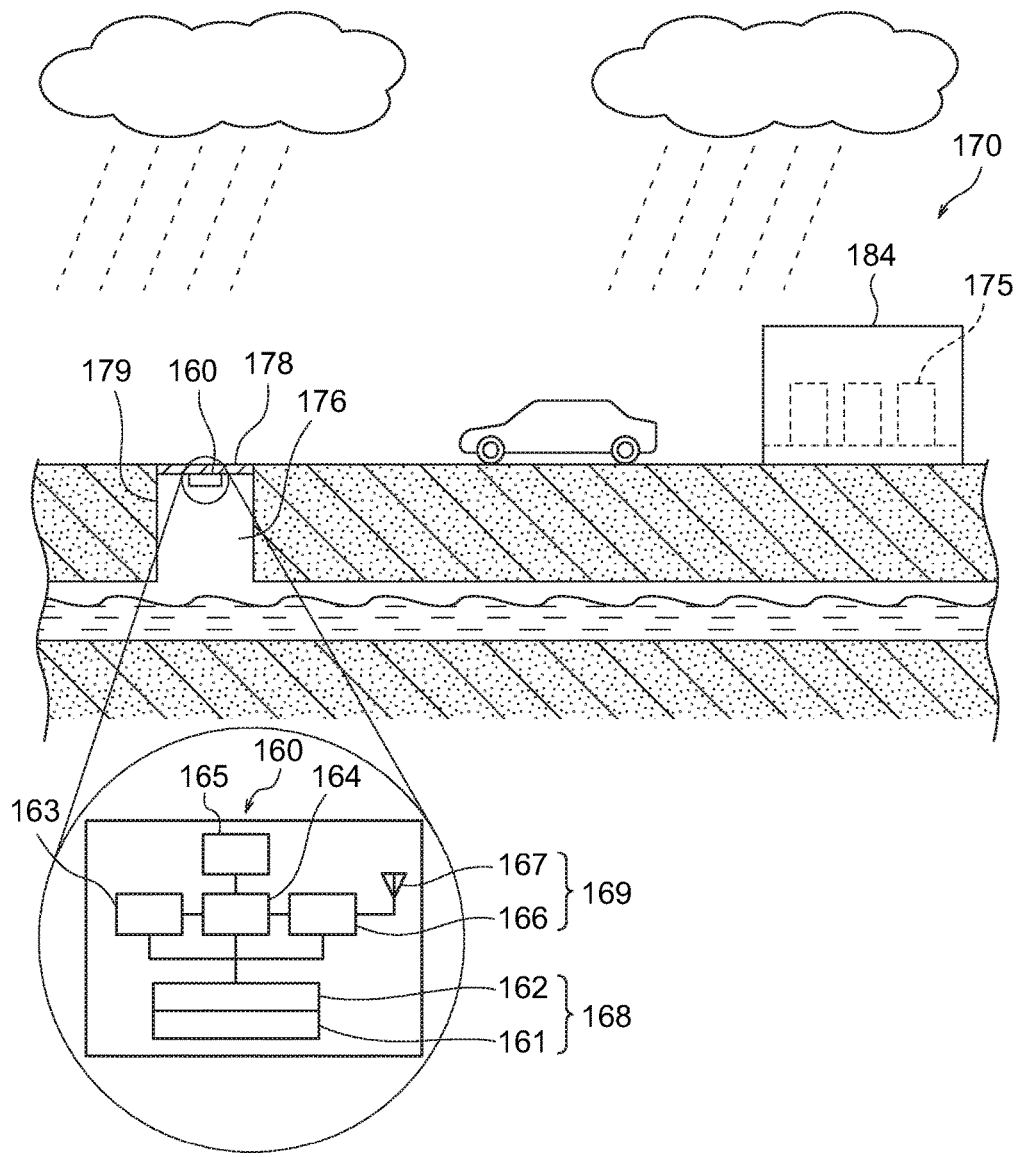
FIG. 34 is a diagram illustrating a usage state of an information processing system according to a fifth example application of the fifth exemplary embodiment.

In the fifth example application illustrated in FIG. 34, the information processing system 170 is employed for measuring amounts of rainfall. For example, an X-band radar for predicting weather is employed as the sensor 163. Radio waves from X-band radar, for example, do not reach beyond an area where rain is falling during heavy rains, and will not cross over large objects such as mountains. Moreover, there are many issues in current radars regarding detection and tracking of areas where heavy rain suddenly or rapidly begins to fall. Highly precise prediction demands high temporal and spatial resolution.

Although the resolution of X-band radar is normally 250 m, installing the sensors 163 in manholes 176 at average intervals of 30 m could conceivably enable more finely detailed weather prediction and assist measurements and predictions for locally concentrated heavy rainfall or the like. Data (signals) output from the sensors 163 is received by the server 175.

Although a dedicated server 175 is employed in the first to the fifth example applications described above, a regular computer may be employed as the server 175. A program that executes operations performed by the controller 164 and the server 175 may be installed and executed in a regular computer that functions as the server 175. In such cases, the program may be supplied using a recording medium or may be downloaded over a network.

Although explanation has been given regarding the first to the fifth exemplary embodiment of technology disclosed herein, technology disclosed herein is not limited to the above description, and obviously, in addition to the above description, various modifications may be implemented within a range not departing from the spirit of technology disclosed herein.

The first to the fifth exemplary embodiment, modified examples thereof, and example application thereof may be implemented in combination as appropriate.

All cited documents, patent applications, and technical standards mentioned in the present specification are incorporated by reference in the present specification to the same extent as if each individual cited document, patent application, or technical standard was specifically and individually indicated to be incorporated by reference.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
a main body formed from a resin;
a connecting member and an electronic component that are encapsulated by the main body;
a heat dissipating sheet that is formed in a sheet shape from a material having higher thermal conductivity than the resin, that covers the main body, and that includes a plurality of fins connected to each other at positions other than apexes and a connecting portion connected to the plurality of fins; and
a covering portion that covers, from an opposite side of the heat dissipating sheet to the main body, at least a portion of a bottom portion of a groove between the plurality of fins, wherein:
the connecting member is directly connected to the connecting portion and the electronic component, and
the main body includes a plurality of protrusions formed by filling the resin into an interior of the plurality of fins, the plurality of protrusions supporting each of the plurality of fins from an apex to a bottom portion.

2. The electronic device of claim 1, wherein
the electronic component is a thermoelectric element thermally connected to an installation target that is provided at an opposite side of the electronic component from the heat dissipating sheet such that the electronic component is sandwiched therebetween.

3. The electronic device of claim 1, wherein:
the covering portion is provided at a bottom portion side of the groove, and
at a side face portion of the fins, a portion further to an apex side of the fins than the covering portion is exposed.

4. The electronic device of claim 1, wherein
the heat dissipating sheet is formed from graphite.

5. The electronic device of claim 1, wherein
the fins have pointed shapes that narrow in width toward the apexes thereof.

6. The electronic device of claim 1, wherein:
the fins extend along a length direction intersecting a direction in which the plurality of fins are arrayed,
an inner side of the fins and the groove are each open in the length direction of the fins, and
a length of the heat dissipating sheet in the length direction is shorter than a length of the main body in the length direction.

7. The electronic device of claim 1, wherein
the bottom portion is at a lower position in a depth direction of the groove than the connecting portion.

8. The electronic device of claim 1, wherein
at least a portion of a surface of the main body, or the covering portion, or a combination thereof, is treated by anti-fouling processing.

9. A manufacturing method for an electronic device, the manufacturing method comprising:
an electronic device comprising:
a main body formed from a resin;
a connecting member and an electronic component that are encapsulated by the main body;
a heat dissipating sheet that is formed in a sheet shape from a material having higher thermal conductivity than the resin, that covers the main body, and that includes a plurality of fins connected to each other at positions other than apexes and a connecting portion connected to the plurality of fins; and
a covering portion that covers, from an opposite side of the heat dissipating sheet to the main body, at least a portion of a bottom portion of a groove between the plurality of fins, wherein:
the connecting member is directly connected to the connecting portion and the electronic component, and
the main body includes a plurality of protrusions formed by filling the resin into an interior of the plurality of fins, the plurality of protrusions supporting each of the plurality of fins from an apex to a bottom portion;
housing an electronic component and a connecting member in a mold together with housing, in the mold, a heat dissipating sheet that is formed from a material having higher thermal conductivity than a resin forming a main body of a heat dissipating component, and that includes a plurality of fins connected to each other at positions other than apexes and a connecting portion connected to the plurality of fins; and
filling the resin into the mold, integrally forming the main body, which encapsulates the electronic component and the connecting member, and the heat dissipating sheet, and forming a covering portion that covers, from an opposite side of the heat dissipating sheet to the main body, at least a portion of a bottom portion of a groove between the plurality of fins from the resin.

10. The manufacturing method for an electronic device of claim 9, wherein
the resin is filled into the mold, and the main body and the covering portion are integrally formed.

11. The manufacturing method for an electronic device of claim 9, wherein
the resin is filled into the mold, and the main body and the covering portion are integrated to the heat dissipating sheet.

12. The manufacturing method for an electronic device of claim 9, wherein:
a set state is adopted in which the heat dissipating sheet bent so as to form the plurality of fins is housed inner side the mold, a length of the heat dissipating sheet along a length direction of the fins is shorter than a length of a cavity formed inner side the mold along the length direction, and the bottom portion is at a lower position in a depth direction of the groove than a leading end portion of a projection of the mold inserted into the groove, and
in the set state, the resin is injected into the mold toward an inner side of the plurality of fins, the resin at the inner side of the plurality of fins passes through a gap between the heat dissipating sheet and a side face of the cavity and fills a gap between a leading end portion of a projection and the bottom portion, so as to form the covering portion from the resin.

13. The manufacturing method for an electronic device of claim 9, wherein
   a set state is adopted in which the heat dissipating sheet bent so as to form the plurality of fins is housed inner side the mold, and an inflow port is formed in the bottom portion, and
   in the set state, the resin is injected into the mold toward an inner side of the plurality of fins, the resin at the inner side of the plurality of fins passes through the inflow port and fills a gap between a leading end portion of a projection and the bottom portion, so as to form the covering portion from the resin.

14. An integrated module comprising:
   a power supply section including a thermoelectric element thermally connected to an installation target;
   a main body that is formed from a resin, the main body encapsulating a connecting member and the thermoelectric element;
   a heat dissipating sheet that is formed in a sheet shape from a material having higher thermal conductivity than the resin, that covers the main body, and that includes a plurality of fins connected to each other at positions other than apexes and a connecting portion connected to the plurality of fins;
   a covering portion that covers, from an opposite side of the heat dissipating sheet to the main body, at least a portion of a bottom portion of a groove between the plurality of fins;
   a detector that operates using power from the power supply section; and
   a communication section that operates using power from the power supply section and that transmits data detected by the detector, wherein:
   the connecting member is directly connected to the connecting portion and the thermoelectric element, and
   the main body includes a plurality of protrusions formed by filling the resin into an interior of the plurality of fins, the plurality of protrusions supporting each of the plurality of fins from an apex to a bottom portion.

15. An information processing system comprising:
   an integrated module; and
   a server that receives data transmitted from the integrated module, the integrated module including:
   a power supply section including a thermoelectric element thermally connected to an installation target;
   a main body that is formed from a resin, the main body encapsulating a connecting member and the thermoelectric element;
   a heat dissipating sheet that is formed in a sheet shape from a material having higher thermal conductivity than the resin, that covers the main body, and that includes a plurality of fins connected to each other at positions other than apexes and a connecting portion connected to the plurality of fins;
   a covering portion that covers, from an opposite side of the heat dissipating sheet to the main body, at least a portion of a bottom portion of a groove between the plurality of fins;
   a detector that operates using power from the power supply section; and
   a communication section that operates using power from the power supply section and that transmits data detected by the detector, wherein:
   the connecting member is directly connected to the connecting portion and the thermoelectric element, and
   the main body includes a plurality of protrusions formed by filling the resin into an interior of the plurality of fins, the plurality of protrusions supporting each of the plurality of fins from an apex to a bottom portion.

* * * * *